US00RE49206E

(19) United States
(12) Reissued Patent
Kang et al.

(10) Patent Number: US RE49,206 E
(45) Date of Reissued Patent: Sep. 6, 2022

(54) NONVOLATILE MEMORY DEVICE, MEMORY SYSTEM INCLUDING THE SAME AND METHOD OF OPERATING THE SAME

(71) Applicant: Samsung Electronics Co., Ltd., Suwon-si (KR)

(72) Inventors: Dae-Woon Kang, Suwon-si (KR); Jeong-don Ihm, Seongnam-si (KR); Byung-Hoon Jeong, Hwaseong-si (KR); Young-Don Choi, Seoul (KR)

(73) Assignee: Samsung Electronics Co., Ltd., Gyeonggi-do (KR)

(21) Appl. No.: 16/692,483

(22) Filed: Nov. 22, 2019

Related U.S. Patent Documents

Reissue of:
(64) Patent No.: 10,205,431
Issued: Feb. 12, 2019
Appl. No.: 15/408,730
Filed: Jan. 18, 2017

(30) Foreign Application Priority Data

Mar. 31, 2016 (KR) ..... 10-2016-0039139

(51) Int. Cl.
*H03K 19/0175* (2006.01)
*G11C 7/00* (2006.01)
(Continued)

(52) U.S. Cl.
CPC ..... *H03H 7/38* (2013.01); *G11C 5/025* (2013.01); *G11C 5/04* (2013.01); *G11C 7/1057* (2013.01);
(Continued)

(58) Field of Classification Search
CPC ..... H03H 7/38; H03K 19/0005; H03K 19/00; H03K 19/017545; H03K 19/0013; H03K 19/00315; H03K 19/11825; H03K 19/018557; G11C 5/025; G11C 5/02; G11C 5/04; G11C 7/10; G11C 7/1057; G11C 7/1084; G11C 16/04; G11C 16/08; G11C 16/10; G11C 16/26; G11C 29/02; G11C 29/022; G11C 29/028; G11C 29/50;
(Continued)

(56) References Cited

U.S. PATENT DOCUMENTS 7,554,353 B2 * 6/2009 Lee ..... H04L 25/0278 326/30
7,679,133 B2 3/2010 Son et al.
(Continued)

FOREIGN PATENT DOCUMENTS

CN 101529394 A 9/2009
CN 102859598 A 1/2013
CN 103021444 A 4/2013

*Primary Examiner* — My Trang Ton
(74) *Attorney, Agent, or Firm* — Harness, Dickey & Pierce, P.L.C.

(57) ABSTRACT

A nonvolatile memory device includes a first memory structure. The first memory structure includes first through N-th memory dies that may be connected to an external memory controller via a first channel. N is a natural number equal to or greater than two. At least one of the first through N-th memory dies is configured to be used as a first representative die that performs an on-die termination (ODT) operation while a data write operation is performed for one of the first through N-th memory dies.

36 Claims, 41 Drawing Sheets

(51) Int. Cl.

| | |
|---|---|
| ***H03H 7/38*** | (2006.01) |
| ***G11C 5/02*** | (2006.01) |
| ***G11C 5/04*** | (2006.01) |
| ***G11C 7/10*** | (2006.01) |
| ***G11C 16/08*** | (2006.01) |
| ***G11C 16/10*** | (2006.01) |
| ***G11C 16/26*** | (2006.01) |
| ***G11C 29/02*** | (2006.01) |
| ***H03K 19/00*** | (2006.01) |
| *G11C 16/04* | (2006.01) |
| *G11C 29/50* | (2006.01) |

(52) U.S. Cl.
CPC ..... *G11C 7/1084* (2013.01); *G11C 16/08* (2013.01); *G11C 16/10* (2013.01); *G11C 16/26* (2013.01); *G11C 29/022* (2013.01); *G11C 29/028* (2013.01); *H03K 19/0005* (2013.01); *H03K 19/017545* (2013.01); *G11C 16/0483* (2013.01); *G11C 29/025* (2013.01); *G11C 29/50008* (2013.01); *G11C 2207/105* (2013.01)

(58) Field of Classification Search
CPC ..... G11C 29/50008; G11C 11/4093; G11C 2207/2254; G11C 29/025; G11C 2207/105; G11C 16/0483; H03M 13/6566
See application file for complete search history.

(56) References Cited

U.S. PATENT DOCUMENTS 8,553,466 B2 10/2013 Han et al.
8,559,235 B2 10/2013 Yoon et al.
8,588,012 B2 * 11/2013 Wilson ..... G06F 13/4234 326/26
8,598,905 B2 12/2013 Oh
8,599,631 B2 * 12/2013 Shaeffer ..... G11C 5/063 365/201
8,654,587 B2 2/2014 Yoon et al.
8,664,972 B2 3/2014 Murayama et al.
8,811,055 B2 * 8/2014 Yoon ..... G11C 7/1057 365/189.05
8,923,065 B2 * 12/2014 Ramachandra ..... G11C 7/227 365/185.2
8,988,102 B2 * 3/2015 Shaeffer ..... G11C 5/063 326/30
9,183,901 B2 * 11/2015 Kim ..... G11C 5/063
9,224,430 B2 * 12/2015 Grunzke ..... G11C 5/04
9,292,391 B2 * 3/2016 Ojalvo ..... G06F 11/1604
9,443,565 B2 * 9/2016 Jung ..... G11C 7/02
9,705,498 B2 * 7/2017 Shaeffer ..... H03K 19/0005
2008/0019207 A1 * 1/2008 Noda ..... G11C 7/1045 365/227
2008/0042684 A1 * 2/2008 Kim ..... H03K 19/0005 326/16
2008/0315913 A1 * 12/2008 Kim ..... G11C 7/1057 326/30
2010/0082911 A1 4/2010 Das
2011/0233648 A1 9/2011 Seol et al.
2013/0002291 A1 * 1/2013 Park ..... H03K 19/017509 326/30
2013/0031326 A1 1/2013 Grunzke
2013/0301372 A1 * 11/2013 Park ..... G11C 5/14 365/227
2014/0062528 A1 3/2014 Park
2014/0145754 A1 5/2014 Jung
2014/0347092 A1 * 11/2014 Amirkhany ..... H03K 19/0005 326/30
2015/0206824 A1 7/2015 Ramachandra et al.
2015/0244364 A1 8/2015 Oh et al.
2015/0279444 A1 10/2015 Vergis et al.
2015/0380090 A1 * 12/2015 Park ..... G11C 16/349 365/185.13
2016/0028395 A1 1/2016 Bains et al.
2016/0036438 A1 2/2016 Kim et al.
2016/0065212 A1 3/2016 McCall et al.

* cited by examiner

NONVOLATILE MEMORY DEVICE, MEMORY SYSTEM INCLUDING THE SAME AND METHOD OF OPERATING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED [APPLICATION] *APPLICATIONS*

This application *is a reissue application for U.S. Pat. No. 10,205,431, issued on Feb. 12, 2019 on U.S. Ser. No. 15/408,730 filed Jan. 18, 2017 and* claims priority under 35 USC § 119 to Korean Patent Application No. 10-2016-0039139, filed on Mar. 31, 2016 in the Korean Intellectual Property Office (KIPO), the contents of *each of* which are herein incorporated by reference in their entirety.

BACKGROUND

1. Technical Field

Example embodiments relate generally to semiconductor memory devices, and more particularly to nonvolatile memory devices, memory systems including the nonvolatile memory devices and methods of operating the nonvolatile memory devices.

2. Description of Related Art

A semiconductor memory device may include an input/output (I/O) buffer for transmitting and/or receiving signals to/from outside. As a reflection occurs due to impedance mismatching and causes noise in the transmitted/received signals, the semiconductor memory device may include an on-die termination (ODT) circuit that provides a signal transmission line with a termination resistance component for impedance matching. The ODT operation may reduce (and/or prevent) the signal from being reflected by using the termination resistor so as to improve signal integrity. Researchers are conducting various research projects on techniques of efficiently controlling the ODT operation.

SUMMARY

At least one example embodiment of the present disclosure provides a nonvolatile memory device capable of efficiently performing an ODT operation.

At least one example embodiment of the present disclosure provides a memory system including the nonvolatile memory device and a method of operating the nonvolatile memory device.

According to example embodiments, a nonvolatile memory device includes a first memory structure. The first memory structure includes first through N-th memory dies that are configured to connected to an external memory controller via a first channel, where N is a natural number equal to or greater than two. At least one of the first through N-th memory dies is configured to be used as a first representative die that performs an on-die termination (ODT) operation while a data write operation is performed for one of the first through N-th memory dies.

According to example embodiments, a memory system includes a memory controller and a first nonvolatile memory device configured to be controlled by the memory controller. The first nonvolatile memory device includes a first memory structure. The first memory structure includes first through N-th memory dies connected to the memory controller via a first channel, where N is a natural number equal to or greater than two. At least one of the first through N-th memory dies in the first memory structure is configured to be used as a first representative die that performs an on-die termination (ODT) operation while a first data write operation is performed for one of the first through N-th memory dies in the first memory structure.

According to example embodiments, a method of operating a nonvolatile memory device is provided. The nonvolatile memory device includes a first memory structure including first through N-th memory dies configured to be connected to an external memory controller via first channel, where N is a natural number equal to or greater than two. The method includes performing a data write operation or a data read operation for one of the first through N-th memory dies, and performing an on-die termination (ODT) operation while the data write operation of the data read operation is performed. The performing the ODT operation includes using at least one of the first through N-th memory dies as a first representative die to perform the ODT operation while the data write operation or the data read operation is performed.

According to example embodiments, a memory system includes a memory controller and a first nonvolatile memory device including a first memory structure. The first memory structure includes first through N-th memory dies connected to the memory controller via a first channel, where N is a natural number equal to or greater than two. One of the first through N-th memory dies in the first memory structure is configured to be used as a first representative die that performs an on-die termination (ODT) operation while a first data operation is performed for a different one of the first through N-th memory dies. The first data operation includes one of a first data write operation and a first data read operation.

In the nonvolatile memory device according to some example embodiments, a representative die may perform the ODT operation based on commands that are directly associated with the data write operation or the data read operation. Accordingly, an additional ODT control signal and/or an additional command for enabling or disabling the ODT mode may be unnecessary, the nonvolatile memory device may efficiently perform the ODT operation without increasing time required for accessing the nonvolatile memory device, and thus the nonvolatile memory device may have relatively enhanced or improved performance. In the nonvolatile memory device according to other example embodiments, the representative die may perform the ODT operation based on an ODT control signal and commands that are directly associated with the data write operation or the data read operation. Accordingly, an additional command for enabling or disabling the ODT mode may be unnecessary, and wirings or signal lines for receiving the ODT control signal may have relatively simple structure because the ODT control signal is shared by a plurality of memory dies.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
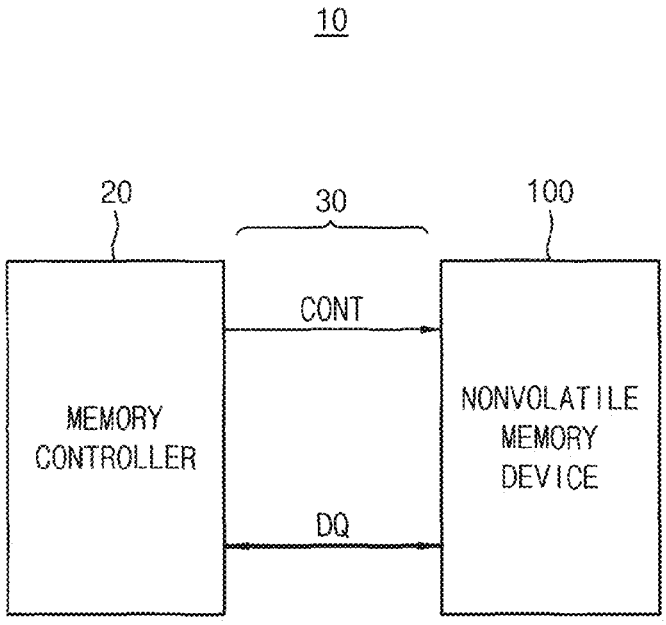
FIG. 1 is a block diagram illustrating a memory system according to example embodiments.

Various example embodiments will be described more fully with reference to the accompanying drawings, in which example embodiments are shown. The present disclosure may, however, be embodied in many different forms and should not be construed as limited to the embodiments set forth herein. Like reference numerals refer to like elements throughout this application.

FIG. 1 is a block diagram illustrating a memory system according to example embodiments.

Referring to FIG. 1, a memory system 10 includes a memory controller 20 and a nonvolatile memory device 100. The memory system 10 may further include a plurality of signal lines 30 that electrically connect the memory controller 20 with the nonvolatile memory device 100.

The nonvolatile memory device 100 is controlled by the memory controller 20. For example, based on requests from a host (not illustrated), the memory controller 20 may store (e.g., write or program) data into the nonvolatile memory device 100, or may retrieve (e.g., read or sense) data from the nonvolatile memory device 100.

The plurality of signal lines 30 may include control signal lines and data input/output (I/O) lines. The memory controller 20 may transmit a control signal CONT to the nonvolatile memory device 100 via the control signal lines, and may exchange data DQ with the nonvolatile memory device 100 via the data I/O lines. For example, the control signal CONT may include a chip enable signal (/CE), a write enable signal (/WE), a read enable signal (/RE), a command latch enable signal (CLE), an address latch enable signal (ALE), etc.

Although not illustrated in FIG. 1, the plurality of signal lines 30 may further include data strobe signal (DQS) lines for transmitting a DQS signal.

In some example embodiments, at least a part or all of the signal lines 30 may be referred to as a channel. The term "channel" as used herein may represent signal lines that include the data I/O lines, command lines for transmitting a command signal and address lines for transmitting an address signal.

Figure 2:
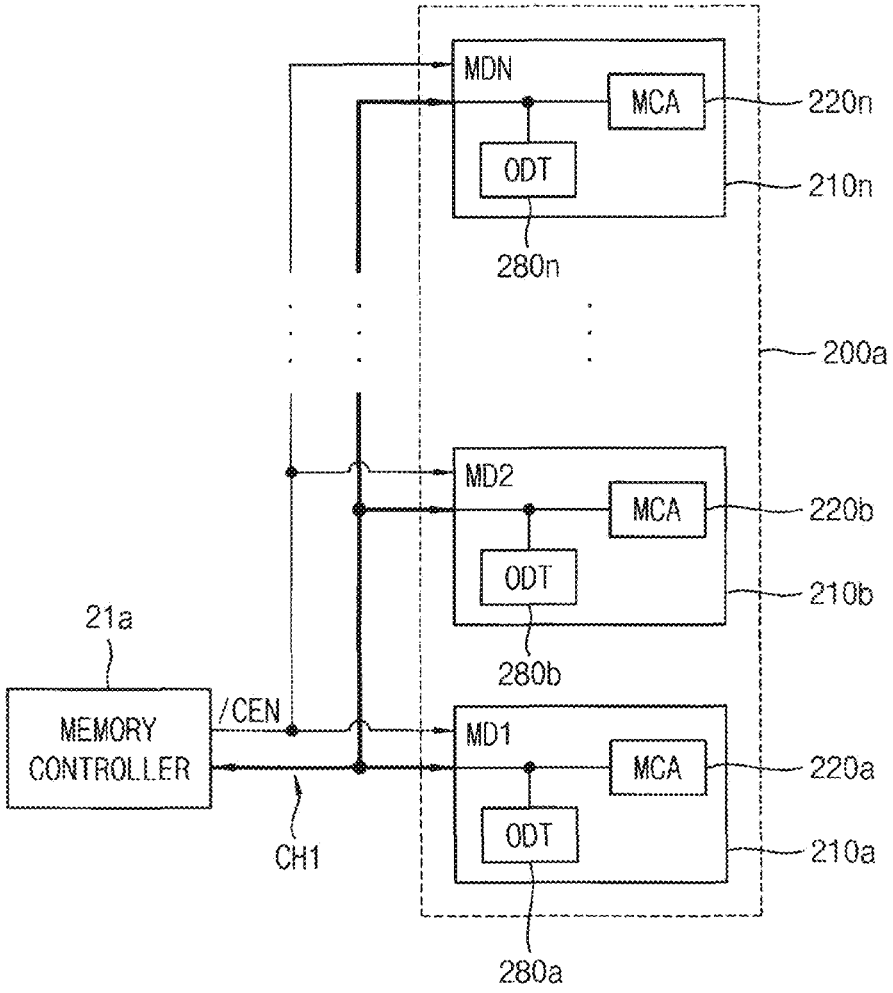
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device according to example embodiments includes a first memory structure 200a that includes first through N-th memory dies 210a, 210b, . . . , 210n, where N is a natural number equal to or greater than two. The first through N-th memory dies 210a, 210b, . . . , 210n are also indicated with reference characters MD1, MD2, . . . MDN.

The first through N-th memory dies 210a~210n are connected to a memory controller 21a via a first channel CH1. In other words, via (or through) a single common channel CH1, the first through N-th memory dies 210a~210n may receive a command signal and an address signal from the memory controller 21a and may exchange data with the memory controller 21a. The memory controller 21a may be located (or disposed) outside of the nonvolatile memory device. In other words, the memory controller 21a may be an external memory controller.

Each of the first through N-th memory dies 210a~210n may include a respective one of first through N-th memory cell arrays 220a, 220b, . . . , 220n and a respective one of first through N-th on-die termination (ODT) circuits 280a, 280b, . . . , 280n. For example, the first memory die 210a may include the first memory cell array 220a and the first ODT circuit 280a.

At least one of the first through N-th memory dies 2106a~210n is configured to be used (and/or alternatively predetermined) as a first representative die. While a data write operation or a data read operation is performed for one of the first through N-th memory dies 210a~210n, the first representative die performs an ODT operation.

The first representative die may be determined before the nonvolatile memory device starts to perform the data write operation or the data read operation. In other words, the first representative die may already be determined before a data write command or a data read command is received. For example, the first representative die may be configured to be used (and/or alternatively predetermined) when the nonvolatile memory device and/or a system (e.g., a memory system or an electronic system) including the nonvolatile memory device is powered on, or by a user setting before the data write operation or the data read operation, or in a manufacturing process of the nonvolatile memory device.

In some example embodiments, the first representative die may be set based on a hardware configuration. For example, the memory controller 21a or an external host (not illustrated) may include a fuse box that includes a plurality of fuses (e.g., an electrical fuse or an anti-fuse). The first representative die may be set based on a control signal that is generated by the fuse box after at least one of the fuses in the fuse box is programmed. In other example embodiments, the first representative die may be set based on a software configuration. For example, the memory controller 21a or the external host may generate a setting signal (or a setting code) such as UIB signal, Set Feature signal, etc. The first representative die may be set based on a value of the setting signal. In still other example embodiments, the first representative die may be set based on both the hardware configuration and the software configuration.

In some example embodiments, the first representative die may be changed. For example, the first representative die may be changed, altered or modified based on at least one of the hardware configuration and the software configuration.

In some example embodiments, the first through N-th memory dies 210a~210n may commonly receive a first chip enable signal /CEN from the memory controller 21a. In other words, in an example of FIG. 2, a single chip enable signal /CEN may be shared by the memory dies 210a~210n included in a first memory structure 200a. The first memory structure 200a may be a single memory structure.

Figure 3:
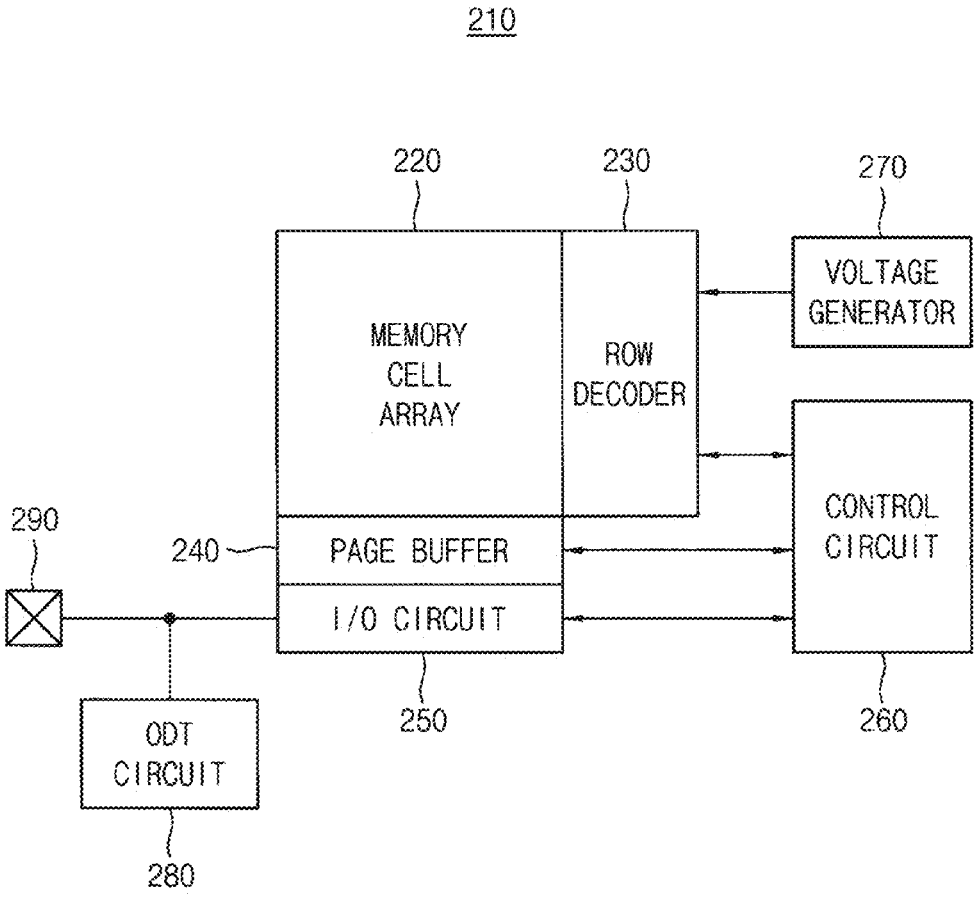
FIG. 3 is a block diagram illustrating a memory die included in the nonvolatile memory device according to example embodiments.

FIG. 3 is a block diagram illustrating a memory die included in the nonvolatile memory device according to example embodiments.

Referring to FIG. 3, a memory die 210 may include a memory cell array 220, a row decoder 230, a page buffer 240, an I/O circuit 250, a control circuit 260, a voltage generator 270, an ODT circuit 280 and an I/O pad 290. Such elements included in the memory die 210 may be integrated on a semiconductor substrate. The memory die 210 may have a configuration substantially the same as that of a single nonvolatile memory.

The memory cell array 220 may include a plurality of memory cells. Each of the plurality of memory cells may be connected to a respective one of a plurality of wordlines and a respective one of a plurality of bitlines. For example, the plurality of memory cells may be nonvolatile memory cells, and may be arranged in a two dimensional (2-D) array structure or a three dimensional (3-D) vertical array structure. The 3-D vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3-D vertical array structure, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The row decoder 230 may be connected to the plurality of wordlines, and may select at least one of the plurality of wordlines in response to a row address.

The page buffer 240 may be connected to the plurality of bitlines, and may store write data to be programmed into the memory cell array 220 or read data sensed from the memory cell array 220. In other words, the page buffer 240 may operate as a write driver or a sensing amplifier according to an operation mode of the memory die 210.

The I/O circuit 250 may provide the write data, which is received from outside of the memory die 210 (e.g., from an external memory controller) via the I/O pad 290, to the memory cell array 220 via the page buffer 240. The I/O circuit 250 may provide the read data, which is output from the memory cell array 220 via the page buffer 240, to the outside of the memory die 210 via the I/O pad 290. The I/O circuit 250 may provide a command signal, an address signal, a control signal, etc., which are received from the outside of the memory die 210 via the I/O pad 290, to the control circuit 260.

The control circuit 260 may control the row decoder 230, the page buffer 240, the I/O circuit 250 and the voltage generator 270 to perform a data write operation, a data read operation and/or a data erase operation for the memory cell array 220. The voltage generator 270 may generate an operating voltage based on a power supply voltage.

The ODT circuit 280 may be connected to the I/O circuit 250 and the I/O pad 290. When the ODT circuit 280 is enabled, the ODT operation may be performed for impedance matching, a signal reflection at an interface between the memory die 210 and the external memory controller may be reduced based on the impedance matching, and thus signal integrity may be improved.

Although FIG. 3 illustrates a single ODT circuit 280 and a single I/O pad 290, the memory die 210 may include a plurality of ODT circuits and a plurality of I/O pads.

Figure 4A:
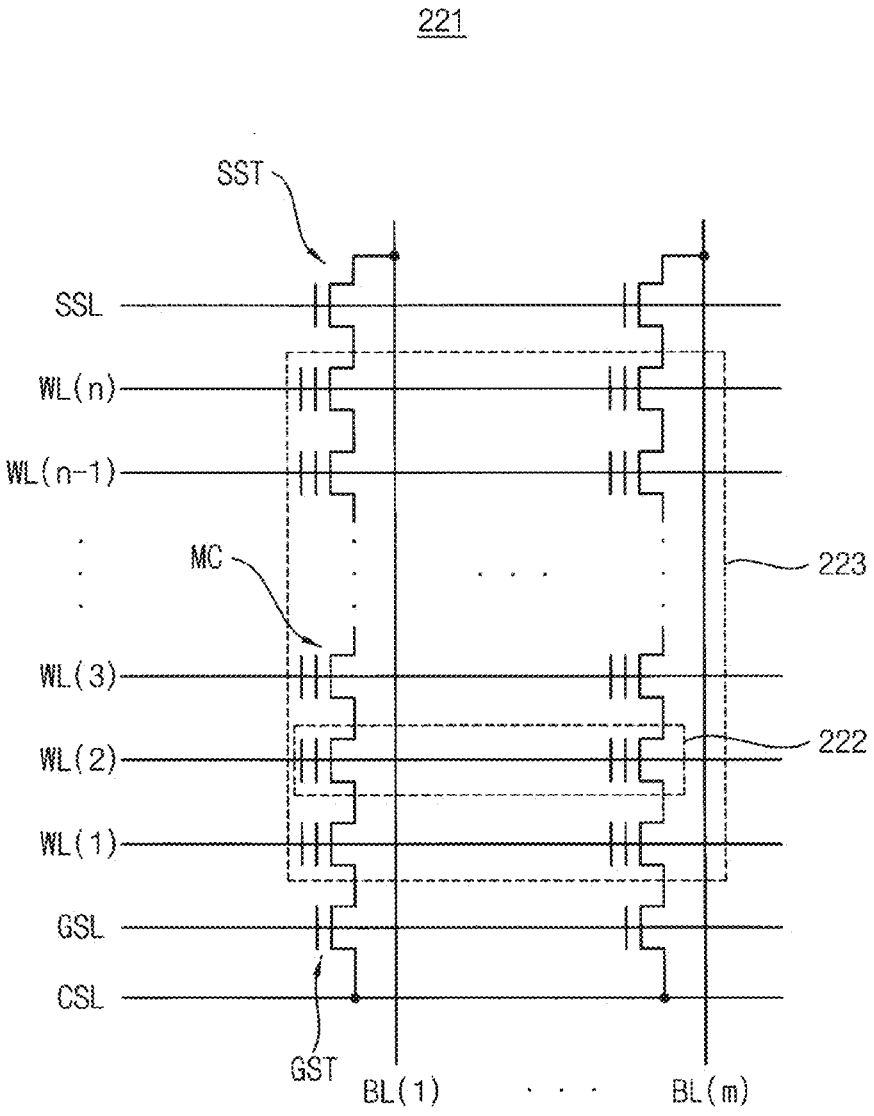
FIGS. 4A and 4B are diagrams illustrating examples of a memory cell array included in the nonvolatile memory device according to example embodiments.
Figure 4B:
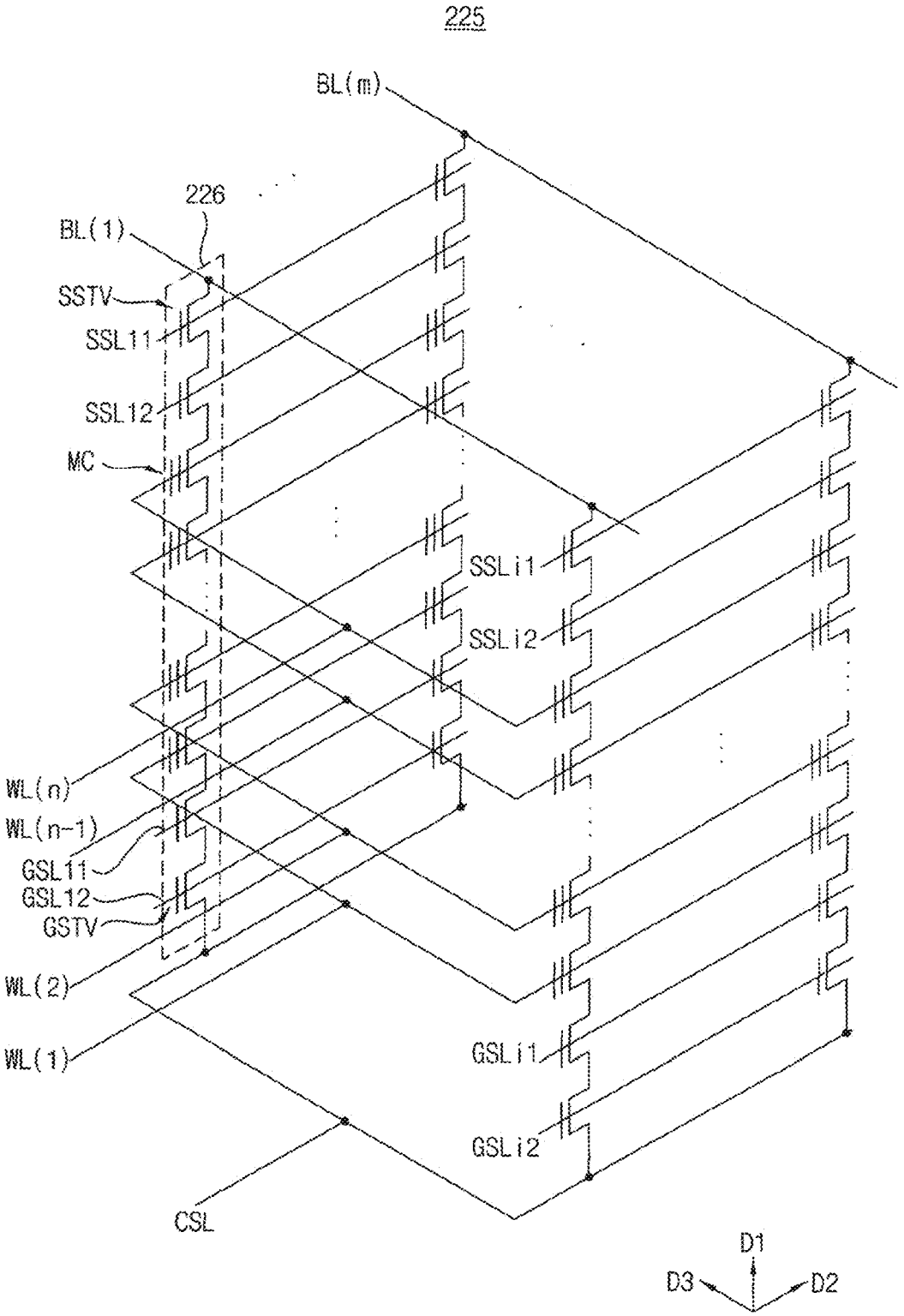

FIGS. 4A and 4B are diagrams illustrating examples of a memory cell array included in the nonvolatile memory device according to example embodiments.

Referring to FIG. 4A, a memory cell array 221 may include string selection transistors SST, memory cells MC and ground selection transistors GST. The string selection transistors SST may be connected to bitlines BL(1), . . . , BL(m) and a string selection line SSL. The ground selection transistors GST may be connected to a common source line CSL and a ground selection line GSL. The memory cells MC may be disposed between the string selection transistors SST and the ground selection transistors GST, and may be connected to wordlines WL(1), WL(2), WL(3), . . . , WL(n−1), WL(n).

The memory cell array 221 may be included in a NAND flash memory device. The memory cell array 221 may perform the data read and write operations in units of a page 222 and the data erase operation in units of a block 223.

Referring to FIG. 4B, a memory cell array 225 may include a plurality of strings 226 that extend in a first direction D1 and are arranged along second and third directions D2 and D3. Each string may include string selection transistors SSTV, memory cells MC and ground selection transistors GSTV. The ground selection transistors GSTV may be connected to ground selection lines GSL11, GSL12, . . . , GSLi1, GSLi2 and a common source line CSL. The string selection transistors SSTV may be connected to string selection lines SSL11, SSL12, . . . , SSLi1, SSLi2 and bitlines BL(1), . . . , BL(m). The memory cells MC may be disposed between the ground selection transistors GSTV and the string selection transistors SSTV, and may be connected to wordlines WL(1), WL(2), . . . , WL(n−1), WL(n).

The memory cell array 225 may be included in a vertical NAND flash memory device. The memory cell array 225 may perform the data read and write operations in units of a page and the data erase operation in units of a block.

Although the example embodiments is described based on a NAND flash memory device, the nonvolatile memory device according to example embodiments may be any nonvolatile memory device.

Figure 5A:
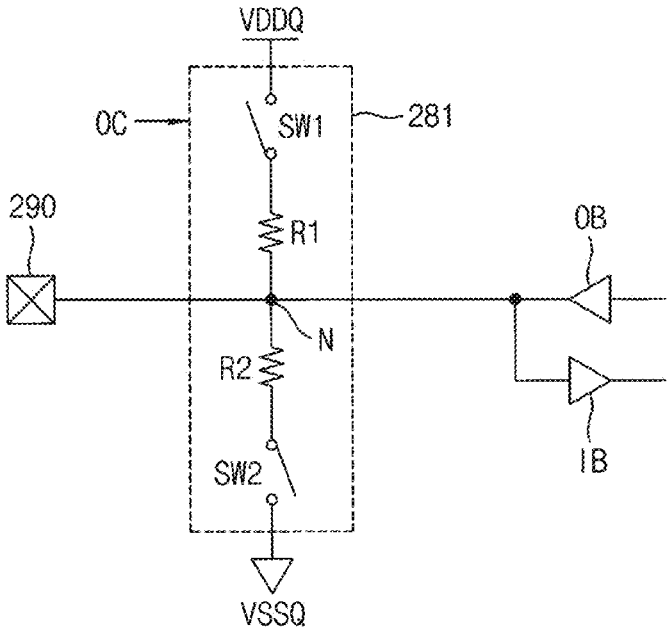
FIGS. 5A, 5B and 5C are circuit diagrams illustrating examples of an ODT circuit included in the nonvolatile memory device according to example embodiments.
Figure 5B:
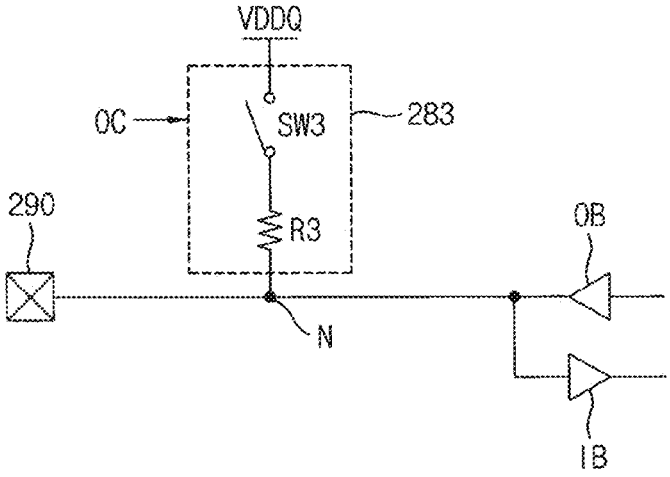
Figure 5C:
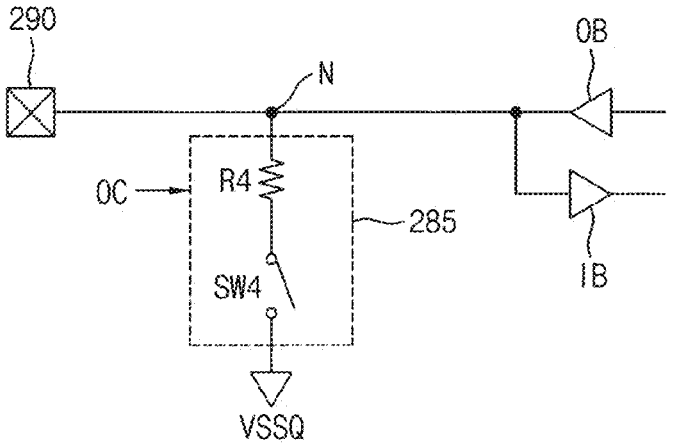

FIGS. 5A, 5B and 5C are circuit diagrams illustrating examples of an ODT circuit included in the nonvolatile memory device according to example embodiments.

Referring to FIG. 5A, an ODT circuit 281 may include a first switch SW1, a first termination resistor R1, a second switch SW2 and a second termination resistor R2.

The first switch SW1 and the first termination resistor R1 may be connected in series between a first power supply voltage VDDQ and a node N, and may be components of a pull-up unit. The second switch SW2 and the second termination resistor R2 may be connected in series between a second power supply voltage VSSQ and the node N, and may be components of a pull-down unit. The node N may be connected to the I/O pad 290, and may be connected to an input terminal of an input buffer IB and an output terminal of an output buffer OB. The input buffer IB and the output buffer OB may be included in the I/O circuit 250 in FIG. 3.

The first and second switches SW1 and SW2 may be turned on or off in response to a control signal OC. For example, each of the first and second switches SW1 and SW2 may include at least one transistor. The first and second termination resistors R1 and R2 may be selectively connected to the node N based on a result of operations of the first and second switches SW1 and SW2, respectively. For example, the first termination resistor R1 may be electrically connected to the node N when the first switch SW1 is turned on.

Figure 6A:
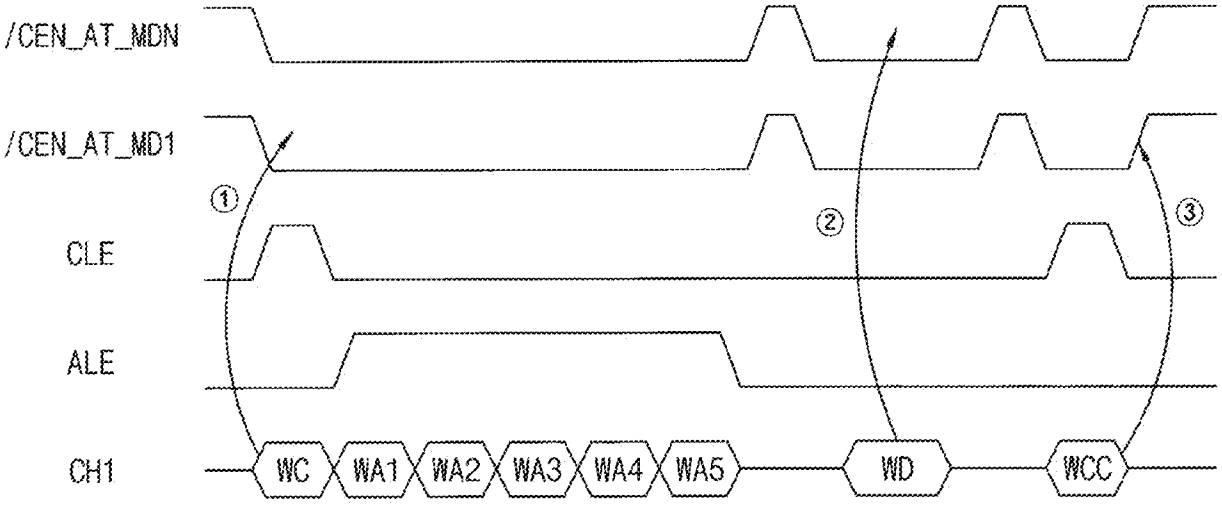
FIGS. 6A and 6B are timing diagrams for describing an operation of the nonvolatile memory device of FIG. 2.
Figure 6B:
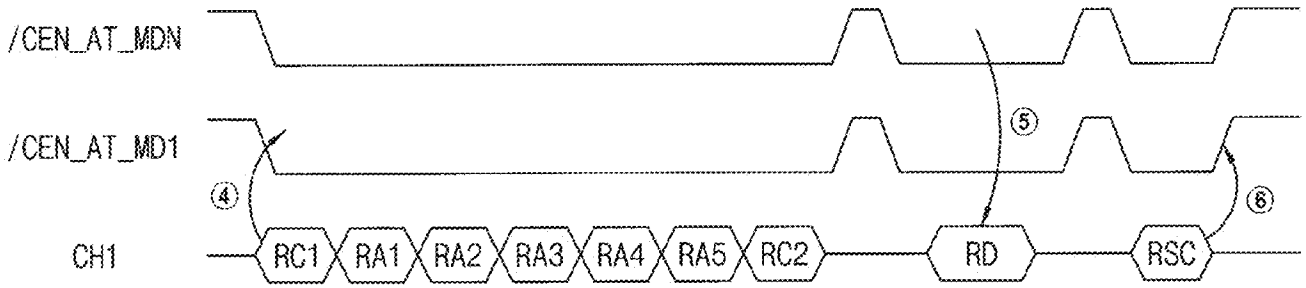

In some example embodiments, the control signal OC may include a data write command (e.g., WC in FIG. 6A) or a data read command (e.g., RC1 in FIG. 6B). In other example embodiments, the control signal OC may include an ODT control signal (e.g., ODT1 in FIG. 11).

Referring to FIG. 5B, an ODT circuit 283 may include a third switch SW3 and a third termination resistor R3. The third switch SW3 and the third termination resistor R3 in FIG. 5B may be substantially the same as the first switch SW1 and the first termination resistor R1 in FIG. 5A, respectively.

Referring to FIG. 5C, an ODT circuit 285 may include a fourth switch SW4 and a fourth termination resistor R4. The fourth switch SW4 and the fourth termination resistor R4 in FIG. 5C may be substantially the same as the second switch SW2 and the second termination resistor R2 in FIG. 5B, respectively.

In examples of FIGS. 5A, 5B and 5C, the input buffer IB may compare an input signal received through the I/O pad 290 with a reference voltage, and may provide a result of the comparison to an internal circuit (e.g., the page buffer 240 in FIG. 3). Assuming that the second power supply voltage VSSQ is a ground voltage (e.g., VSSQ=0V), the reference voltage may have a level of about VDDQ/2 in the example of FIG. 5A, may have a level between VDDQ and VDDQ/2 in the example of FIG. 5B, and may have a level between VDDQ/2 and VSSQ in the example of FIG. 5C. The example of FIG. 5A may be referred to as a center-tapped termination (CTT) configuration, and the examples of FIGS. 5B and 5C may be referred to as a pseudo-open drain (POD) configuration.

FIGS. 6A and 6B are timing diagrams for describing an operation of the nonvolatile memory device of FIG. 2. FIG. 6A illustrates an example of the data write operation, and FIG. 6B illustrates an example of the data read operation. In FIGS. 6A and 6B, the N-th memory die 210n may be a target die such that the data write operation or the data read operation is performed for the N-th memory die 210n, and the first memory die 210a may be the first representative die.

Referring to FIGS. 2 and 6A, to perform the data write operation and the ODT operation, the first chip enable signal /CEN is activated (e.g., transitioned from a high level to a low level), a command latch enable signal CLE is activated (e.g., transitioned from a low level to a high level), and then a data write command WC is received from the memory controller 21a via the first channel CH1. For example, the data write command WC may have a value of "80h." The first memory die 210a enters an ODT mode for performing the ODT operation based on an activated chip enable signal /CEN_AT_MD1 and the data write command WC (e.g., ① in FIG. 6A). For example, the first memory die 210a may perform or establish setting for the ODT operation. When a reception of the data write command WC is completed, the command latch enable signal CLE is deactivated (e.g., transitioned from the high level to the low level).

After the command latch enable signal CLE is deactivated, an address latch enable signal ALE is activated (e.g., transitioned from a low level to a high level), and then write addresses WA1, WA2, WA3, WA4 and WA5 are received from the memory controller 21a via the first channel CH1. The N-th memory die 210n prepares to perform the data write operation based on an activated chip enable signal /CEN_AT_MDN, the data write command WC and the write addresses WA1~WA5. When a reception of the write addresses WA1~WA5 is completed, the address latch enable signal ALE is deactivated (e.g., transitioned from the high level to the low level), and the first chip enable signal /CEN is deactivated (e.g., transitioned from the low level to the high level).

After the address latch enable signal ALE is deactivated, the first chip enable signal /CEN is activated again, and then write data WD is received from the memory controller 21a via the first channel CH1. The write data WD is stored into the N-th memory die 210n based on the activated chip enable signal /CEN_AT_MDN and the write addresses WA1~WA5 (e.g., ② in FIG. 6A). The first memory die 210a performs the ODT operation based on the activated chip enable signal /CEN_AT_MD1. For example, a termination resistor (e.g., R1 and R2 in FIG. 5A, R3 in FIG. 5B, or R4 in FIG. 5C) included in the first ODT circuit 280a may be electrically connected to an I/O pad of the first memory die 210a. When a storage of the write data WD is completed, the first chip enable signal /CEN is deactivated.

After then, the first chip enable signal /CEN is activated again, the command latch enable signal CLE is activated again, and then a data write completion command WCC is received from the memory controller 21a via the first channel CH1. For example, the data write completion command WCC may have a value of "10h." The first memory die 210a exits the ODT mode based on the activated chip enable signal /CEN_AT_MD1 and the data write completion command WCC (e.g., ③ in FIG. 6A). When a reception of the data write completion command WCC is completed, the command latch enable signal CLE and the first chip enable signal /CEN are deactivated.

In some example embodiments, while the data write completion command WCC is received, the first memory die 210a may further perform the ODT operation based on the activated chip enable signal /CEN_AT_MD1.

Referring to FIGS. 2 and 6B, to perform the data read operation and the ODT operation, the first chip enable signal /CEN is activated, and then a first data read command RC1, read addresses RA1, RA2, RA3, RA4 and RA5 and a second data read command RC2 are sequentially received from the memory controller 21a via the first channel CH1. For example, the first data read command RC1 may have a value of "00h" or "05h," and the second data read command RC2 may have a value of "30h" or "E0h." The N-th memory die 210n prepares to perform the data read operation based on the activated chip enable signal /CEN_AT_MDN, the data read commands RC1 and RC2 and the read addresses RA1~RA5. The first memory die 210a enters the ODT mode to perform the ODT operation based on the activated chip enable signal /CEN_AT_MD1 and the first data read command RC1 (e.g., ④ in FIG. 6B). When a reception of the second data read command RC2 is completed, the first chip enable signal /CEN is deactivated.

After then, the first chip enable signal /CEN is activated again, and then read data RD is output from the N-th memory die 210n based on the activated chip enable signal /CEN_AT_MDN and the read addresses RA1~RA5 (e.g., ⑤ in FIG. 6B). The read data RD is provided to the memory controller 21a via the first channel CH1. The first memory die 210a performs the ODT operation based on the activated chip enable signal /CEN_AT_MD1. When an output of the read data RD is completed, the first chip enable signal /CEN is deactivated.

After then, the first chip enable signal /CEN is activated again, and then a reset command RSC is received from the memory controller 21a via the first channel CH1. For example, the reset command RSC may have a value of "9Bh." The first memory die 210a exits the ODT mode based on the activated chip enable signal /CEN_AT_MD1 and the reset command RSC (e.g., ⑥ in FIG. 6B). When a reception of the reset command RSC is completed, the first chip enable signal /CEN are deactivated.

In some example embodiments, while the reset command RSC is received, the first memory die 210a may further perform the ODT operation based on the activated chip enable signal /CEN_AT_MD1.

Although not illustrated in FIG. 6B, the command latch enable signal CLE may be activated while a command signal (e.g., RC1, RC2 and RSC) is received, and the address latch enable signal ALE may be activated while an address signal (e.g., RA1~RA5) is received.

Figure 7:
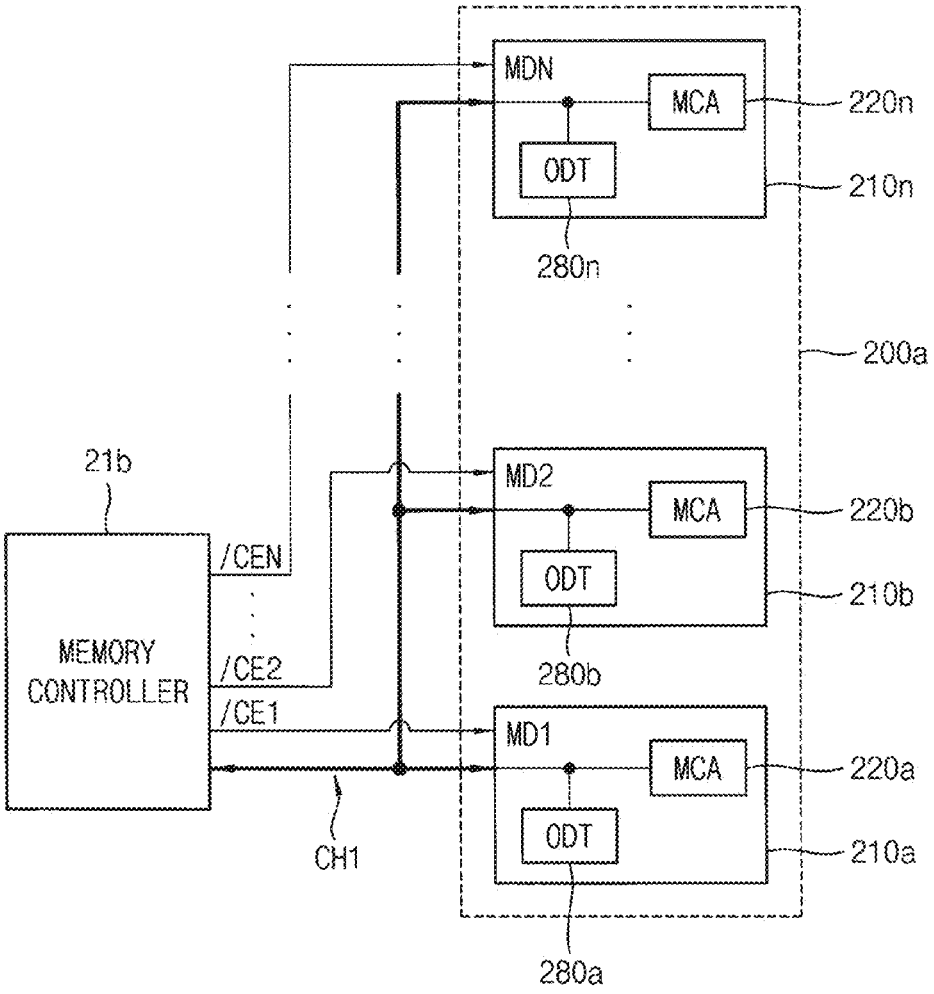
FIG. 7 is a block diagram illustrating a nonvolatile memory device according to example embodiments.

FIG. 7 is a block diagram illustrating a nonvolatile memory device according to example embodiments.

A nonvolatile memory device of FIG. 7 may be substantially the same as the nonvolatile memory device of FIG. 2, except that a configuration for chip enable signals in FIG. 7 is different from a configuration for the chip enable signal /CEN in FIG. 2.

Referring to FIG. 7, each of first through N-th memory dies 210a~210n may receive a respective one of first through N-th chip enable signals /CE1, /CE2, . . . , /CEN from a memory controller 21b. For example, the first memory die 210a may receive the first chip enable signal /CE1 from the memory controller 21b. In other words, in an example of FIG. 7, the chip enable signals /CE1~/CEN applied to the memory dies 210a~210n may be split up or separated from one another, and the number of the chip enable signals /CE1~/CEN may be substantially the same as the number of the memory dies 210a~210n.

Figure 8A:
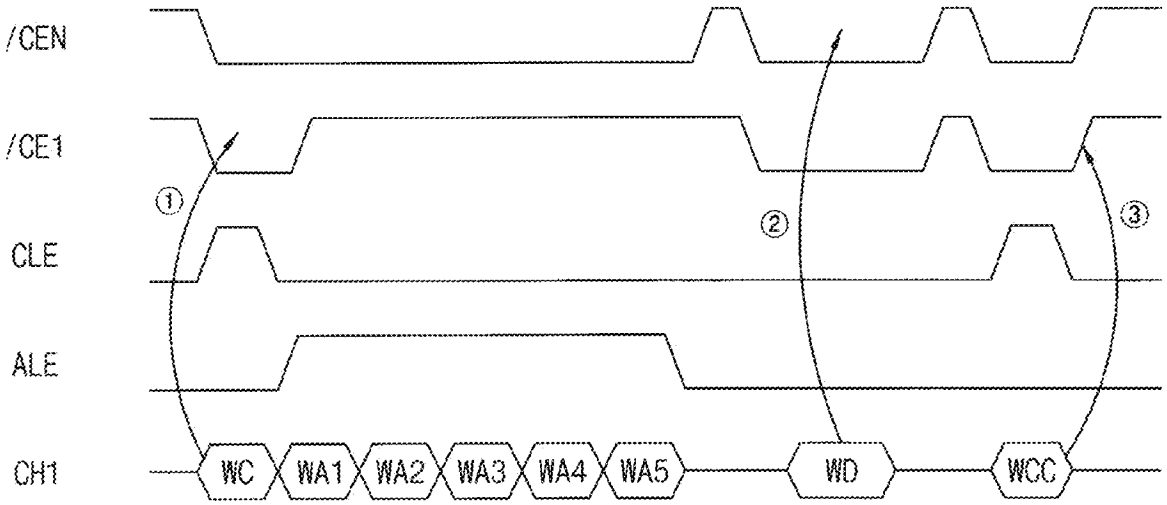
FIGS. 8A and 8B are timing diagrams for describing an operation of the nonvolatile memory device of FIG. 7.
Figure 8B:
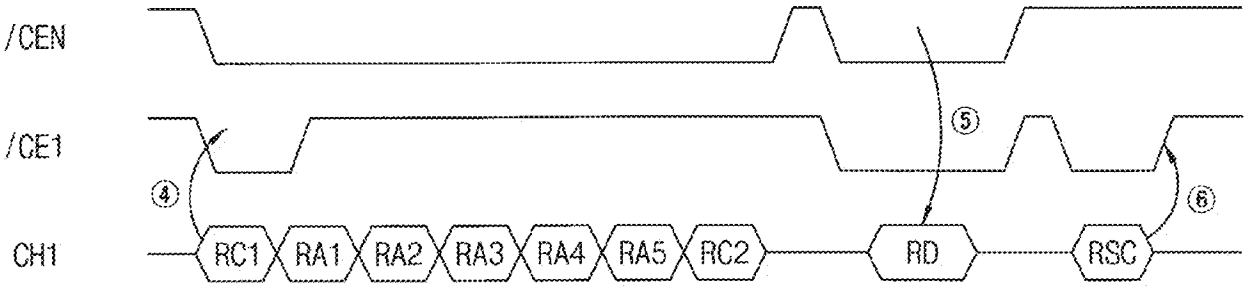

FIGS. 8A and 8B are timing diagrams for describing an operation of the nonvolatile memory device of FIG. 7. FIG. 8A illustrates an example of the data write operation, and FIG. 8B illustrates an example of the data read operation.

Operations of FIGS. 8A and 8B may be substantially the same as the operations of FIGS. 6A and 6B, respectively, except that the chip enable signal /CE1 applied to the first memory die 210a is separated from the chip enable signal /CEN applied to the N-th memory die 210n in FIGS. 8A and 8B. For example, a timing of the signal /CEN in FIG. 8A may be substantially the same as a timing of the signal /CEN_AT_MDN in FIG. 6A. A timing of the signal /CE1 in FIG. 8A may be substantially the same as a timing of the signal /CEN_AT_MD1 in FIG. 6A, except that the signal /CE1 in FIG. 8A is deactivated after the command latch enable signal CLE is deactivated (not after the address latch enable signal ALE is deactivated). Timings of the signals /CE1 and /CEN in FIG. 8B may be substantially the same as timings of the signals /CE1 and /CEN in FIG. 8A, respectively.

In the examples of FIGS. 6A and 8A, the ODT mode may be enabled from a time point at which the data write command WC is received to a time point at which the data write completion command WCC is received. In the examples of FIGS. 6B and 8B, the ODT mode may be enabled from a time point at which the first data read command RC1 is received to a time point at which the reset command RSC is received.

In the nonvolatile memory device described with reference to FIGS. 2 and 7, an additional ODT control signal and/or an additional command for enabling or disabling the ODT mode may be unnecessary. Accordingly, the nonvolatile memory device may efficiently perform the ODT operation without increasing time required for accessing the nonvolatile memory device, and thus the nonvolatile memory device may have relatively enhanced or improved performance.

Figure 9:
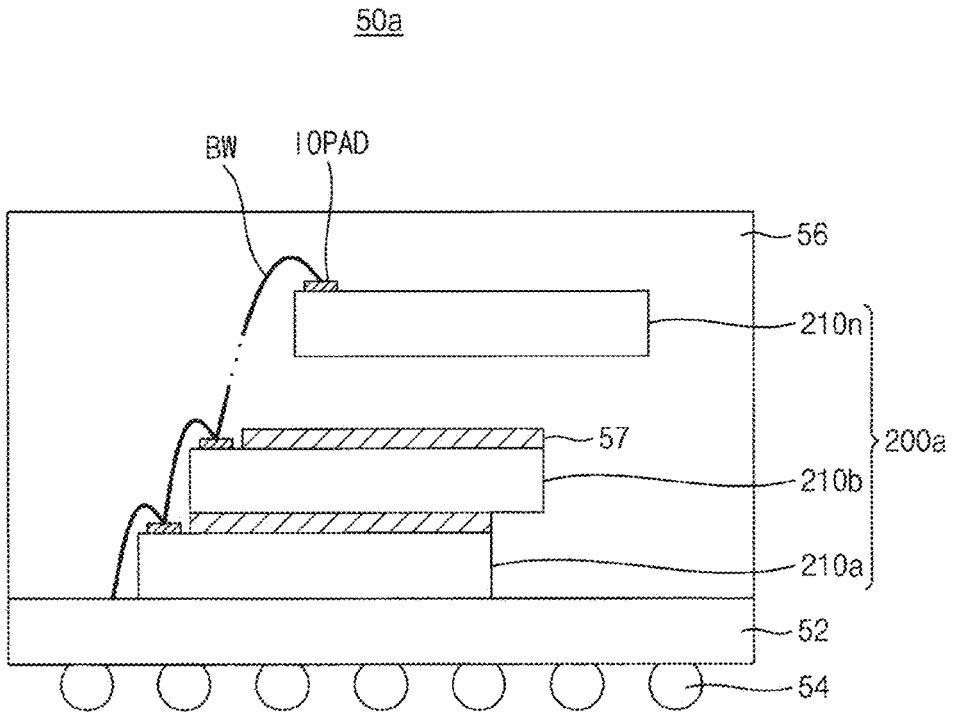
FIGS. 9 and 10 are cross-sectional views of a nonvolatile memory device according to example embodiments.
Figure 10:
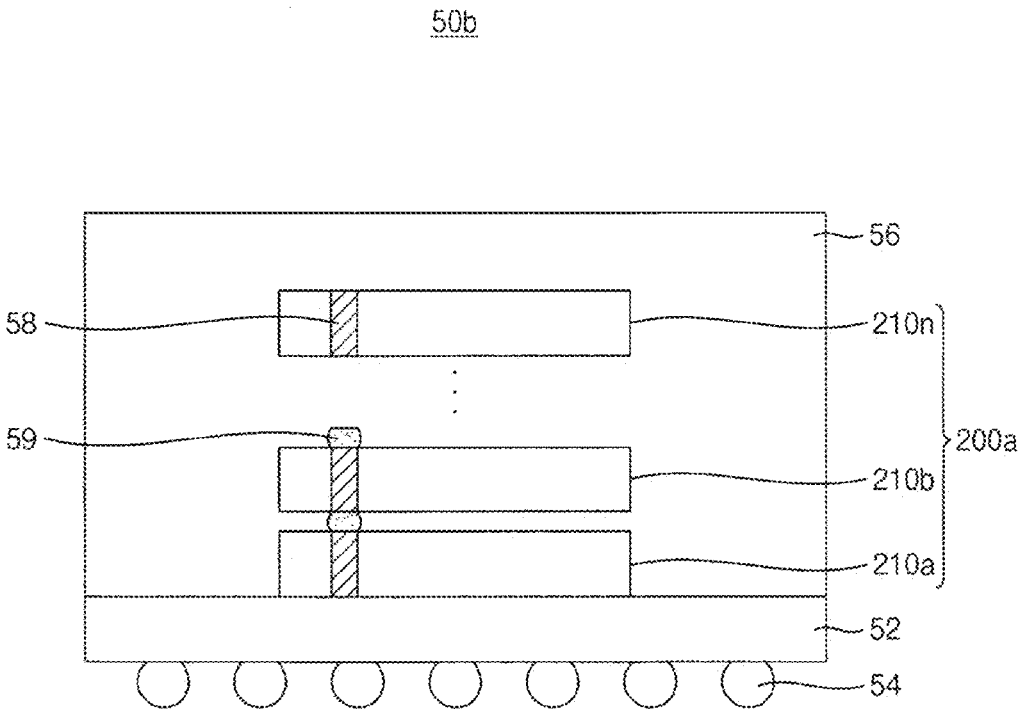

FIGS. 9 and 10 are cross-sectional views of a nonvolatile memory device according to example embodiments.

Referring to FIGS. 2, 7 and 9, a nonvolatile memory device according to example embodiments may be implemented as a multi-stacked chip package 50a.

The multi-stacked chip package 50a may include a base substrate 52 and a first memory structure 200a that is disposed on the base substrate 52. The first memory structure 200a may include first through N-th memory dies 210a~210n that are sequentially stacked on one another.

Each of the first through N-th memory dies 210a~210n in FIG. 9 may include a plurality of I/O pads IOPAD. For example, the plurality of I/O pads IOPAD may include data I/O pads, command pads, address pads, etc.

In some example embodiments, the first through N-th memory dies 210a~210n may be stacked on the base substrate 52 such that a surface on which the plurality of I/O pads IOPAD may be disposed faces upwards. In some example embodiments, with respect to each of the first through N-th memory dies 210a~210n, the plurality of I/O pads IOPAD may be arranged near one side of each memory die. As such, the first through N-th memory dies 210a~210n may be stacked scalariformly, that is, in a step shape, such that the plurality of I/O pads IOPAD of each memory die may be exposed (e.g., the plurality of I/O pads IOPAD may be exposed on the edge of each step). In such stacked state, the first through N-th memory dies 210a~210n may be electrically connected to one another and the base substrate 52 through the plurality of I/O pads IOPAD and a plurality of bonding wires BW.

In some example embodiments, the first channel CH1 in FIGS. 2 and 7 may be formed by the plurality of I/O pads IOPAD and the plurality of bonding wires BW.

The stacked memory dies 210a~210n and the bonding wires BW may be fixed by a sealing member 56, and adhesive members 57 may intervene between the memory dies 210a~210n. Conductive bumps 54 may be disposed on a bottom surface of the base substrate 52 for electrical connections to the external device.

Referring to FIGS. 2, 7 and 10, a nonvolatile memory device according to example embodiments may be implemented as a multi-stacked chip package 50b.

The multi-stacked chip package 50b may include a base substrate 52 and a first memory structure 200a that is disposed on the base substrate 52. The first memory structure 200a may include first through N-th memory dies 210a~210n that are sequentially stacked on one another.

Each of the first through N-th memory dies 210a~210n in FIG. 10 may include a plurality of through silicon vias (TSVs) 58 that are disposed through each memory die. For example, a single TSV may be disposed through a portion of or a whole of a semiconductor substrate included in a single memory die. For example, the plurality of TSVs 58 may include data I/O TSVs, command TSVs, address TSVs, etc.

In some example embodiments, with respect to each of the first through N-th memory dies 210a~210n, the plurality of TSVs 58 may be arranged at the same locations in each memory die. As such, the first through N-th memory dies 210a~210n may be stacked such that the plurality of TSVs 58 of each memory die may be completely overlapped (e.g., arrangements of the plurality of TSVs 58 may be perfectly matched in the memory dies 210a~210n). In such stacked state, the first through N-th memory dies 210a~210n may be electrically connected to one another and the base substrate 52 through the plurality of TSVs 58 and conductive material 59.

In some example embodiments, the first channel CH1 in FIGS. 2 and 7 may be formed by the plurality of TSVs 58 and the conductive material 59.

A sealing member 56 and conductive bumps 54 in FIG. 10 may be substantially the same as the sealing member 56 and the conductive bumps 54 in FIG. 9, respectively.

Figure 11:
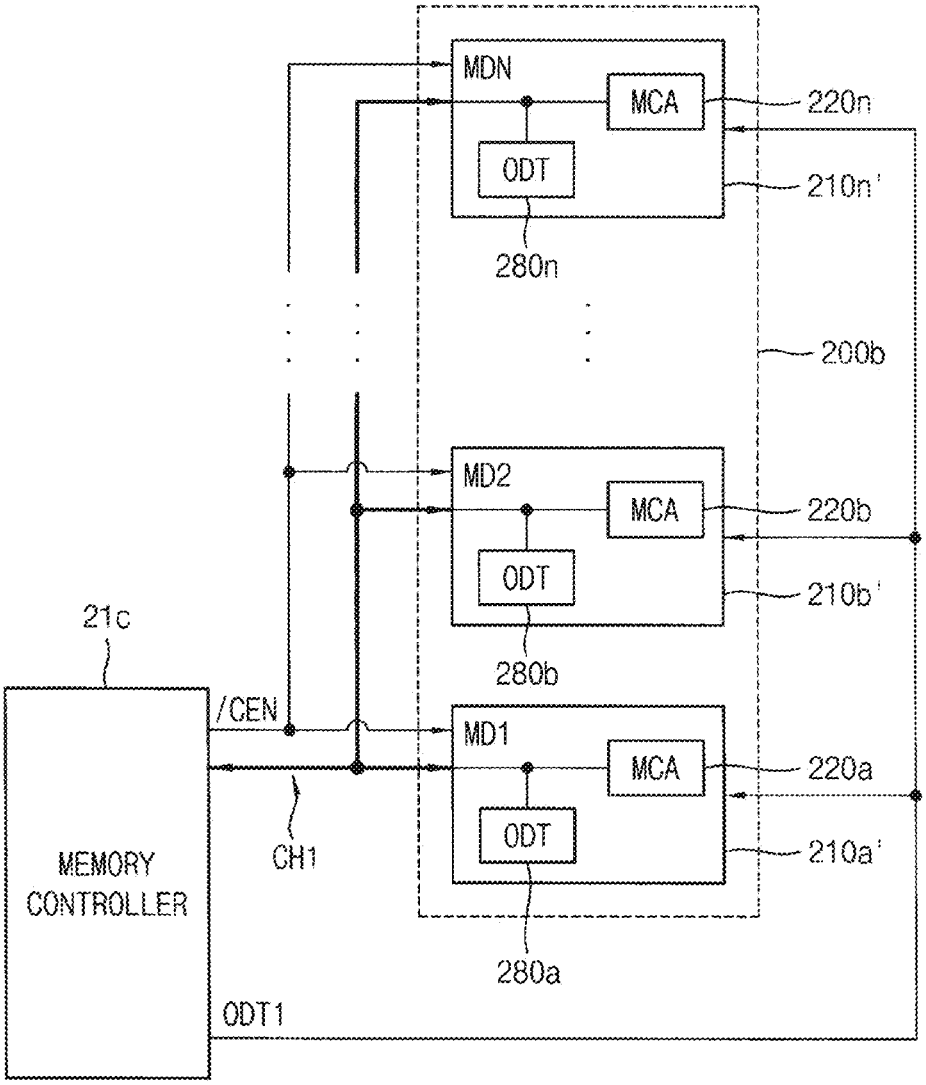
FIG. 11 is a block diagram illustrating a nonvolatile memory device according to example embodiments.

FIG. 11 is a block diagram illustrating a nonvolatile memory device according to example embodiments.

A nonvolatile memory device of FIG. 11 may be substantially the same as the nonvolatile memory device of FIG. 2, except that the nonvolatile memory device of FIG. 11 further includes a configuration for an ODT control signal.

Referring to FIG. 11, a nonvolatile memory device according to example embodiments includes a first memory structure 200b that includes first through N-th memory dies 210a', 210b', . . . , 210n'. The first through N-th memory dies 210a'~210n' may commonly receive a first chip enable signal /CEN and a first ODT control signal ODT1 from a memory controller 21c. In other words, in an example of FIG. 11, a single chip enable signal /CEN and a single ODT control signal ODT1 may be shared by the memory dies 210a'~210n' included in a first memory structure 200b. The first memory structure 2006b may be a single memory structure.

Figure 12A:
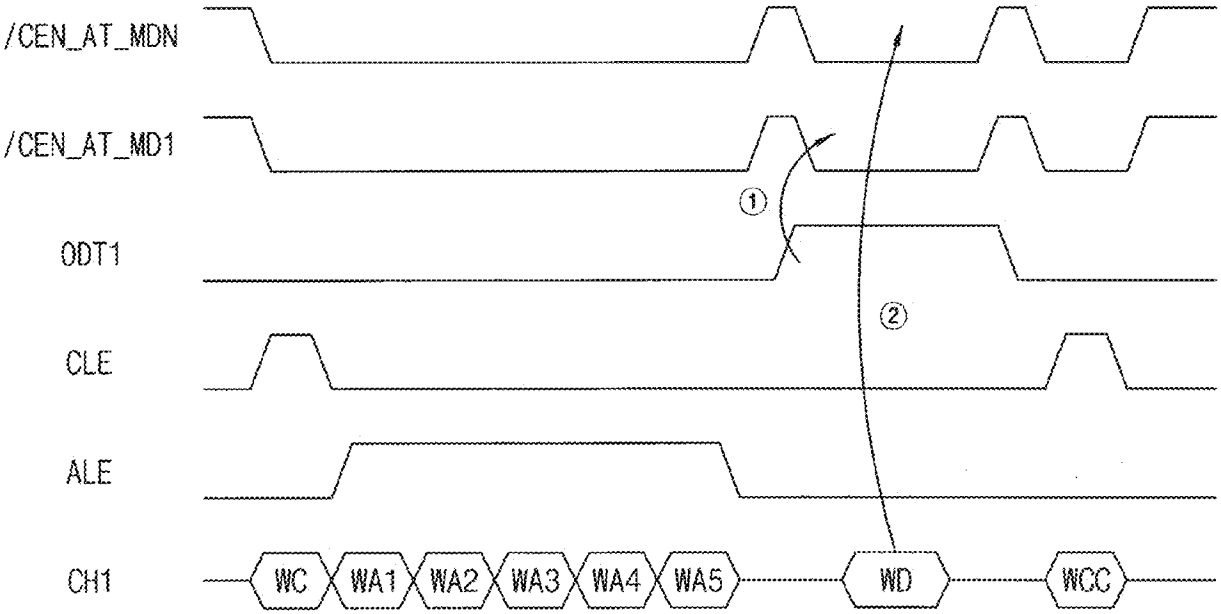
FIGS. 12A and 12B are timing diagrams for describing an operation of the nonvolatile memory device of FIG. 11.
Figure 12B:
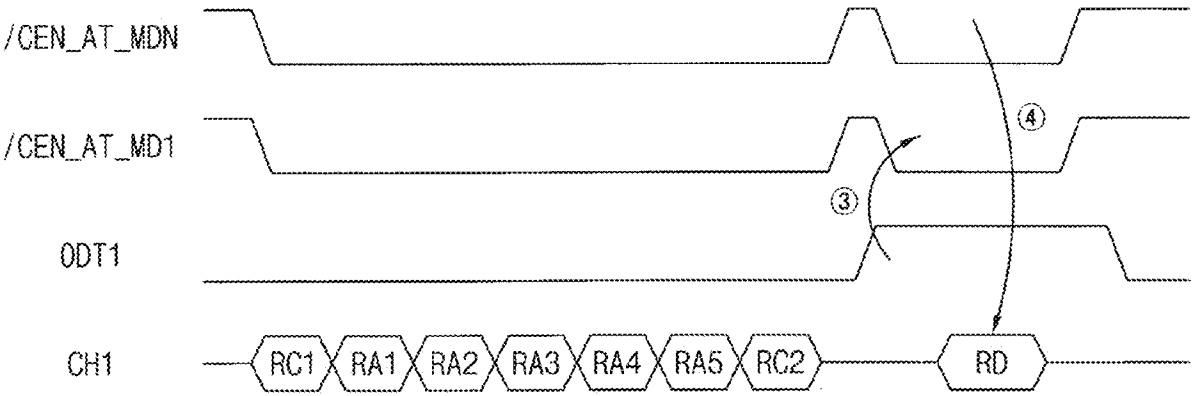

FIGS. 12A and 12B are timing diagrams for describing an operation of the nonvolatile memory device of FIG. 11. FIG. 12A illustrates an example of the data write operation, and FIG. 12B illustrates an example of the data read operation.

Operations of FIGS. 12A and 12B may be substantially the same as the operations of FIGS. 6A and 6B, respectively, except that the first ODT control signal ODT1 is further included in FIGS. 12A and 12B. In examples of FIGS. 12A and 12B, the ODT mode may be enabled while the first ODT control signal ODT1 is activated.

In the nonvolatile memory device described with reference to FIG. 11, an additional command for enabling or disabling the ODT mode may be unnecessary. In addition, the first ODT control signal ODT1 may be shared by a plurality of memory dies, and thus a wiring or a signal line for receiving the first ODT control signal ODT1 may have relatively simple structure in the nonvolatile memory device of FIG. 11.

Although FIG. 11 illustrates an example where the memory dies 210a'~210n' commonly receive a single ODT control signal ODT1, chip enable signals applied to the memory dies 210a'~210n' may be split up or separated from one another, as described with reference to FIG. 7.

Although FIGS. 6A, 6B, 8A, 8B, 12A and 12B illustrate examples where the N-th memory die is the target die and the first memory die is the first representative die, the target die may be a K-th memory die and the first representative die may be an L-th memory die, where each of K and L is a natural number equal to or less than one and equal to or greater than N. An ODT operation in which the first representative die is substantially the same as the target die may be referred to as a self-termination operation, and an ODT operation in which the first representative die is different from the target die may be referred to as the other-termination operation.

Figure 13:
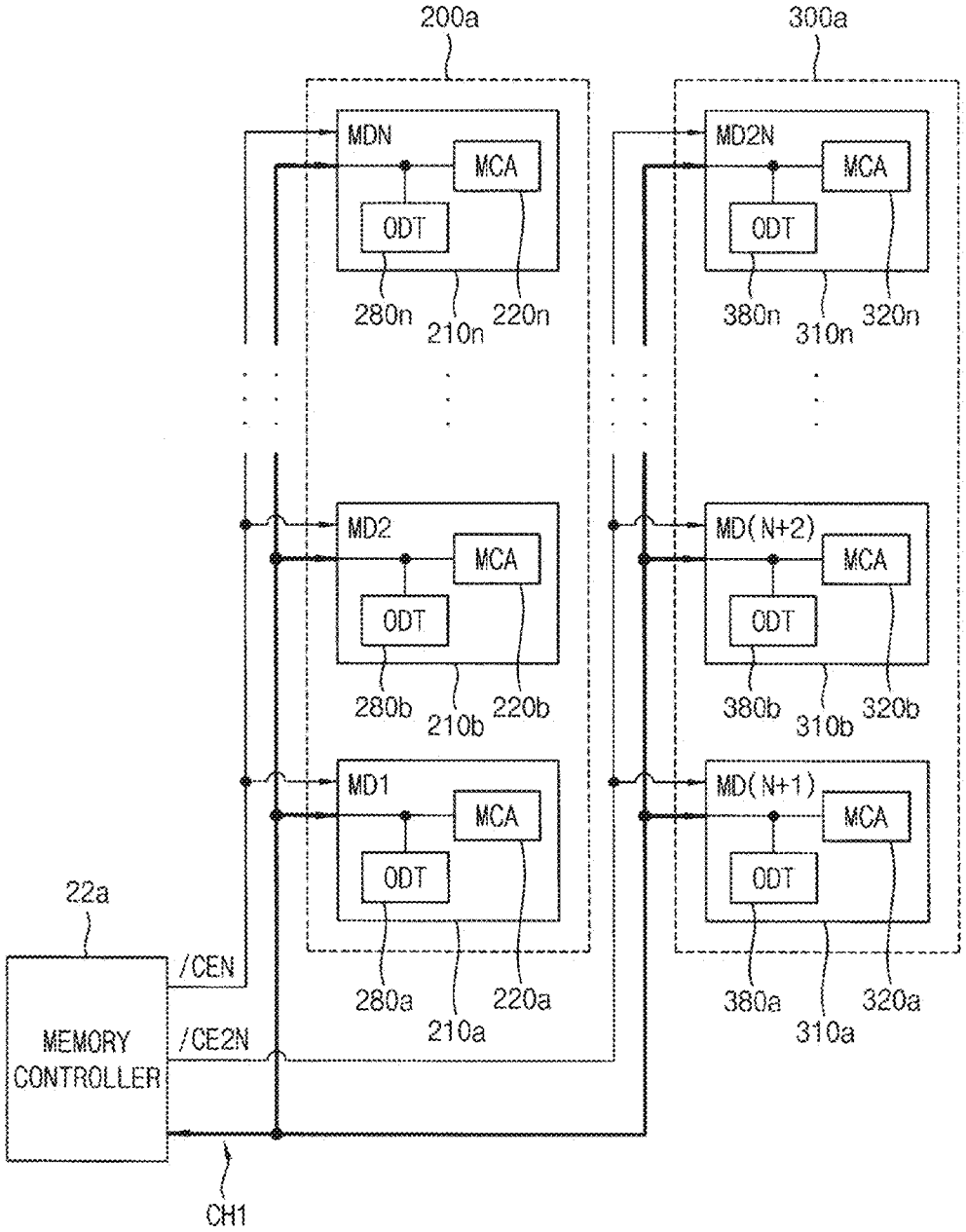
FIG. 13 is a block diagram illustrating a nonvolatile memory device according to example embodiments.

FIG. 13 is a block diagram illustrating a nonvolatile memory device according to example embodiments.

A nonvolatile memory device of FIG. 13 may be substantially the same as the nonvolatile memory device of FIG. 2, except that the nonvolatile memory device of FIG. 13 further includes an additional memory structure.

Referring to FIG. 13, a nonvolatile memory device according to example embodiments includes a first memory structure 200a and a second memory structure 300a. The first memory structure 200a includes first through N-th memory dies 210a~210n, and the second memory structure 300a includes (N+1)-th through 2N-th memory dies 310a, 310b, . . . , 310n.

The first through N-th memory dies 210a~210n and the (N+1)-th through 2N-th memory dies 310a~310n are connected to a memory controller 22a via a first channel CH1. In other words, via a single common channel CH1, the first through 2N-th memory dies 210a~210n and 310a~310n may receive a command signal and an address signal from the memory controller 22a and may exchange data with the memory controller 22a.

Each of the first through N-th memory dies 210a~210n may include a respective one of first through N-th memory cell arrays 220a~220n and a respective one of first through N-th ODT circuits 280a~280n. Similarly, each of the (N+1)-th through 2N-th memory dies 310a~310n may include a respective one of (N+1)-th through 2N-th memory cell arrays 320a, 320b, . . . , 320n and a respective one of first through N-th ODT circuits 380a, 380b, . . . , 380n.

At least one of the first through N-th memory dies 210a~210n is configured to be used (and/or alternatively predetermined) as a first representative die. At least one of the (N+1)-th through 2N-th memory dies 310a~310n is configured to be used (and/or alternatively predetermined) as a second representative die. While a data write operation or a data read operation is performed for one of the first through 2N-th memory dies 210a~210n and 310a~310n, the first and second representative dies performs an ODT operation.

In some example embodiments, the first through N-th memory dies 210a~210n may commonly receive a first chip enable signal /CEN from the memory controller 22a. The (N+1)-th through 2N-th memory dies 310a~310n may commonly receive a second chip enable signal /CE2N from the memory controller 22a.

Figure 14A:
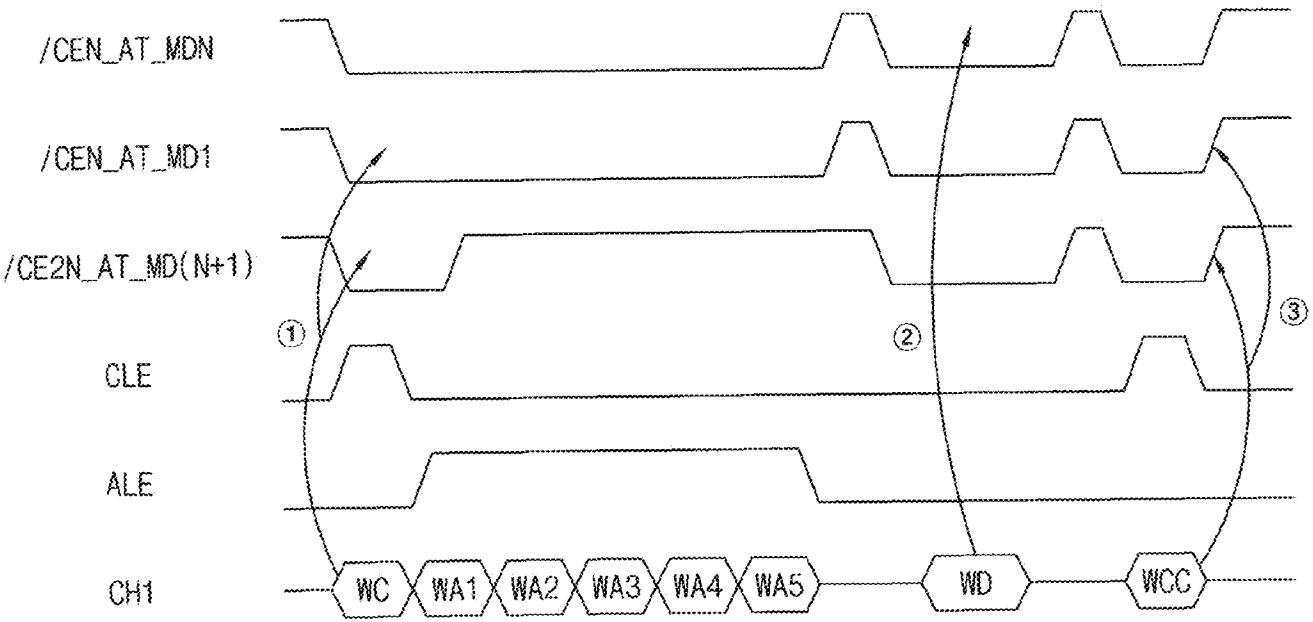
FIGS. 14A and 14B are timing diagrams for describing an operation of the nonvolatile memory device of FIG. 13.
Figure 14B:
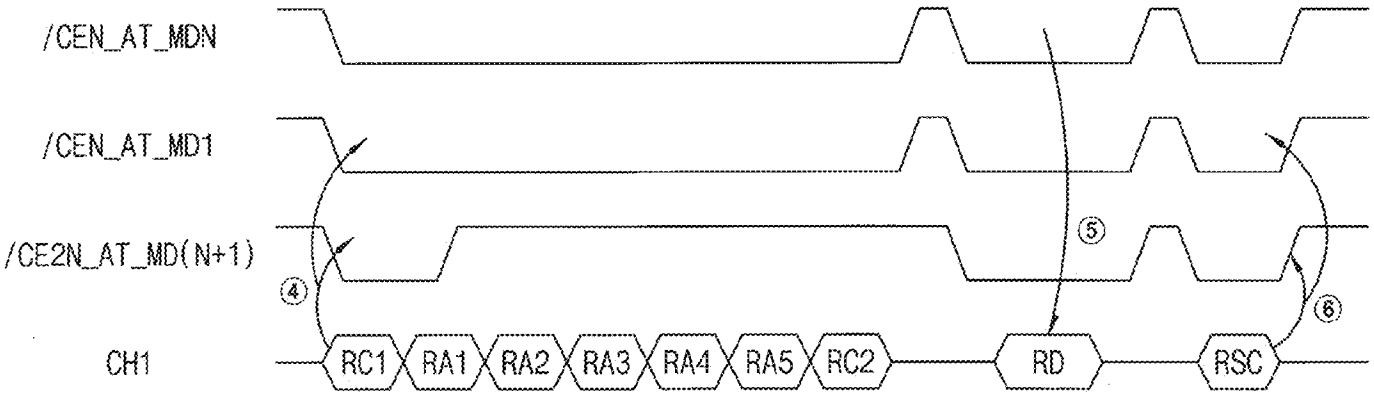

FIGS. 14A and 14B are timing diagrams for describing an operation of the nonvolatile memory device of FIG. 13. FIG. 14A illustrates an example of the data write operation, and FIG. 14B illustrates an example of the data read operation. In FIGS. 14A and 14B, the N-th memory die 210n may be the target die, the first memory die 210a may be the first representative die, and the (N+1)-th memory die 310a may be the second representative die.

Operations of FIGS. 14A and 14B may be substantially the same as the operations of FIGS. 6A and 6B, respectively, except that the second chip enable signal /CE2N is further included in FIGS. 14A and 14B. For example, a timing of a chip enable signal /CE2N_AT_MD(N+1) applied to the (N+1)-th memory die 310a in FIGS. 14A and 14B may be substantially the same as a timing of the signal /CE1 in FIGS. 8A and 8B.

Figure 15:
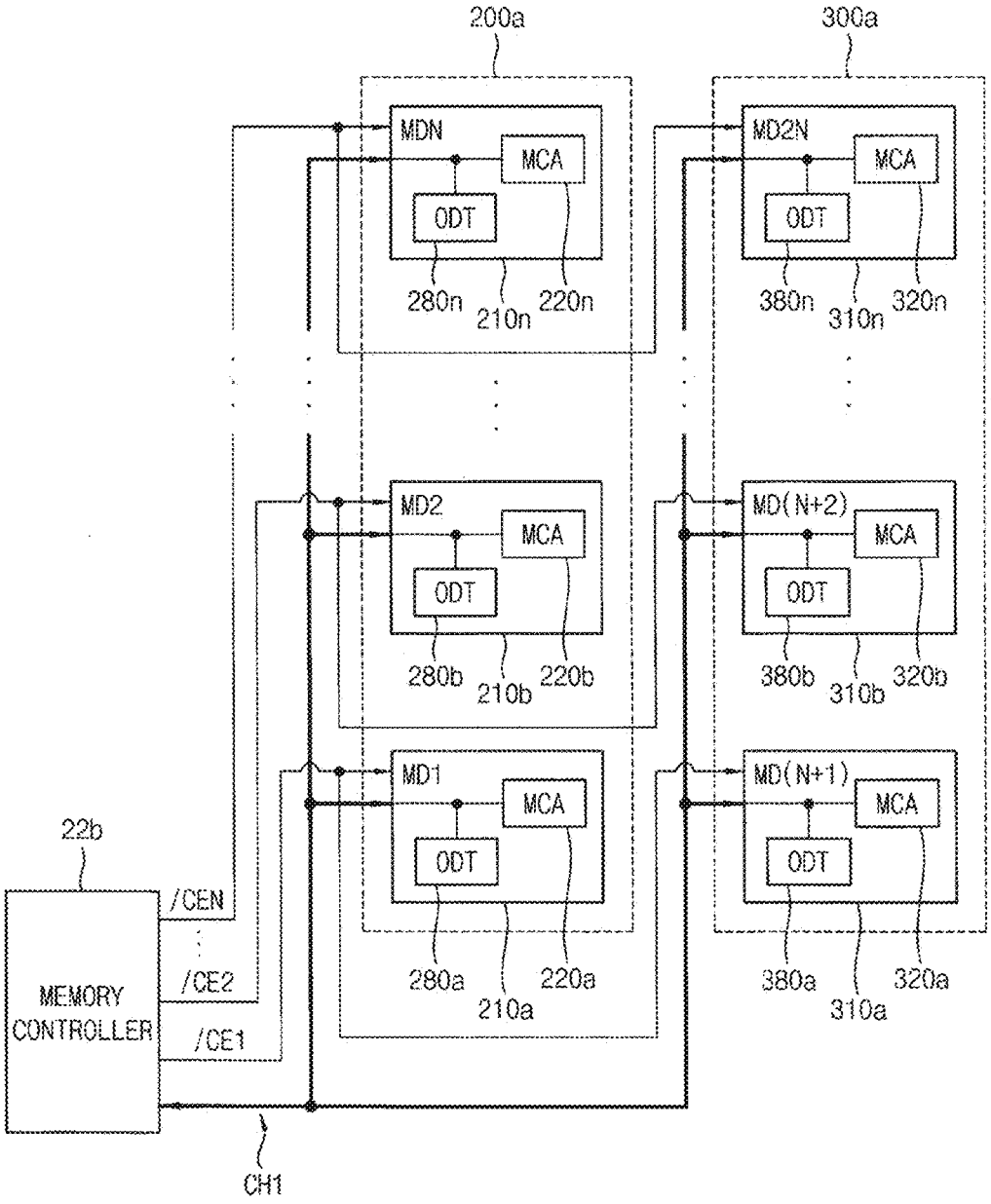
FIG. 15 is a block diagram illustrating a nonvolatile memory device according to example embodiments.

FIG. 15 is a block diagram illustrating a nonvolatile memory device according to example embodiments.

A nonvolatile memory device of FIG. 15 may be substantially the same as the nonvolatile memory device of FIG. 13, except that a configuration for chip enable signals in FIG. 15 is different from a configuration for the chip enable signals /CEN and /CE2N in FIG. 13.

Referring to FIG. 15, each of first through N-th memory dies 210a~210n may receive a respective one of first through N-th chip enable signals /CE1~/CEN from a memory controller 22b. Each of (N+1)-th through 2N-th memory dies 310a~310n may receive a respective one of the first through N-th chip enable signals /CE1~/CEN from the memory controller 22b. The first and (N+1)-th memory dies 210a and 310a may commonly receive the first chip enable signal /CE1, the second and (N+2)-th memory dies 210b and 310b may commonly receive the second chip enable signal /CE2, and the N-th and 2N-th memory dies 210n and 310n may commonly receive the N-th chip enable signal /CEN. In other words, in an example of FIG. 15, a single chip enable signal (e.g., /CE1) may be shared by memory dies (e.g., 210a and 310a) that are disposed or formed in the same location or layer in the memory structures 200a and 300a.

Figure 16A:
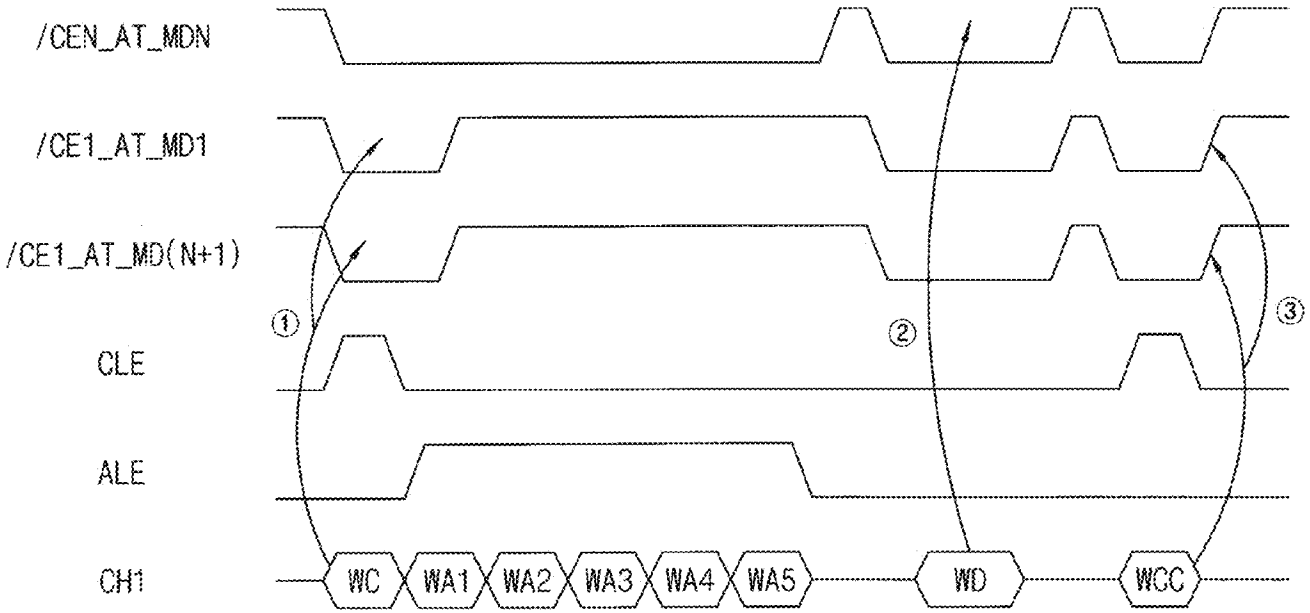
FIGS. 16A and 16B are timing diagrams for describing an operation of the nonvolatile memory device of FIG. 15.
Figure 16B:
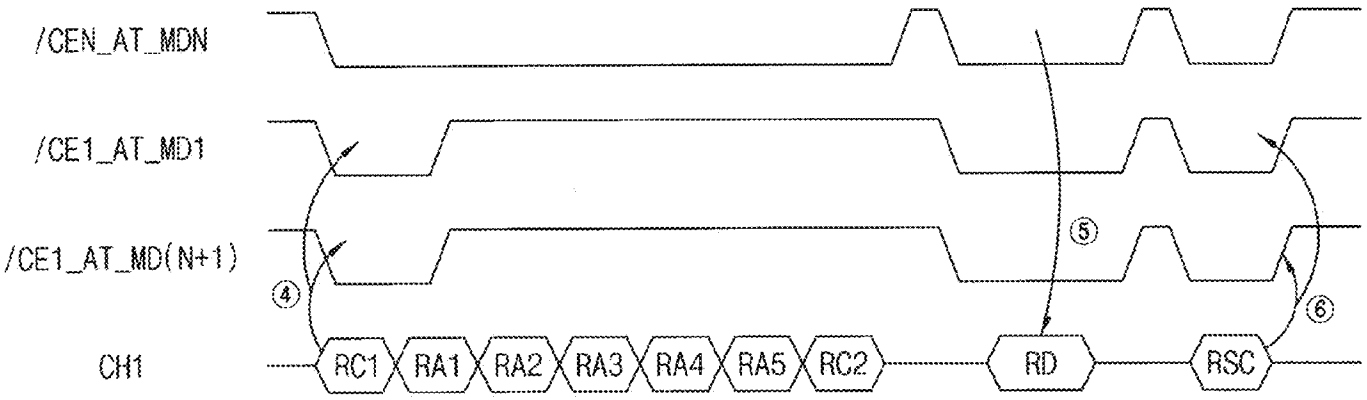

FIGS. 16A and 16B are timing diagrams for describing an operation of the nonvolatile memory device of FIG. 15. FIG. 16A illustrates an example of the data write operation, and FIG. 16B illustrates an example of the data read operation.

Operations of FIGS. 16A and 16B may be substantially the same as the operations of FIGS. 14A and 14B, respectively, except that the chip enable signal /CE1 applied to the first and (N+1)-th memory dies 210a and 310a is separated from the chip enable signal /CEN applied to the N-th memory die 210n in FIGS. 16A and 16B. For example, a timing of a chip enable signal /CE1_AT_MD1 applied to the first memory die 210a and a timing of a chip enable signal /CE1_AT_MD(N+1) applied to the (N+1)-th memory die 310a in FIGS. 16A and 16B may be substantially the same as a timing of the signal /CE2N_AT_MD(N+1) in FIGS. 14A and 14B.

Figure 17:
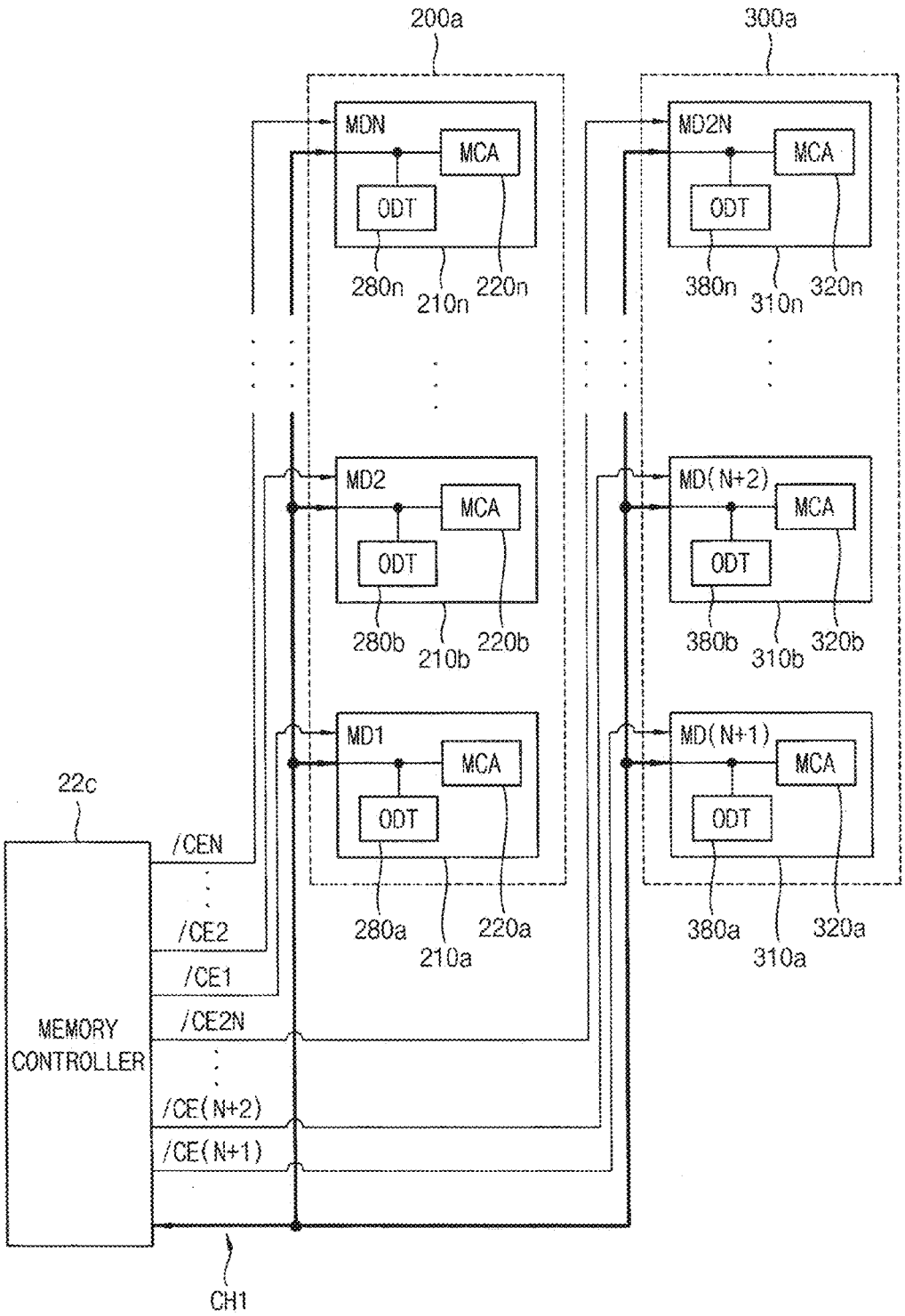
FIG. 17 is a block diagram illustrating a nonvolatile memory device according to example embodiments.

FIG. 17 is a block diagram illustrating a nonvolatile memory device according to example embodiments.

A nonvolatile memory device of FIG. 17 may be substantially the same as the nonvolatile memory device of FIG. 13, except that a configuration for chip enable signals in FIG. 17 is different from a configuration for the chip enable signals /CEN and /CE2N in FIG. 13.

Referring to FIG. 17, each of first through N-th memory dies 210a~210n may receive a respective one of first through N-th chip enable signals /CE1~/CEN from a memory controller 22c. Each of (N+1)-th through 2N-th memory dies 310a~310n may receive a respective one of the (N+1)-th through 2N-th chip enable signals /CE(N+1), /CE(N+2), . . . , /CE2N from the memory controller 22c. In other words, in an example of FIG. 17, all of the chip enable signals /CE1~/CEN and /CE(N+1)~/CE2N applied to the memory dies 210a~210n and 310a~310n may be split up or separated from one another.

Figure 18A:
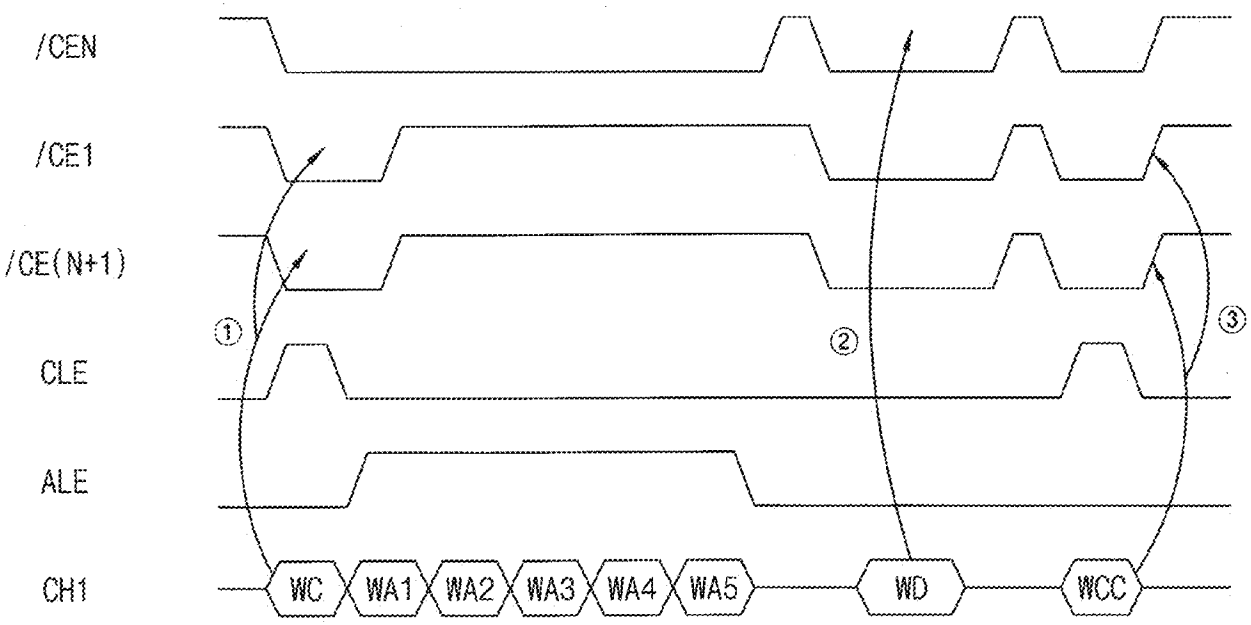
FIGS. 18A and 18B are timing diagrams for describing an operation of the nonvolatile memory device of FIG. 17.
Figure 18B:
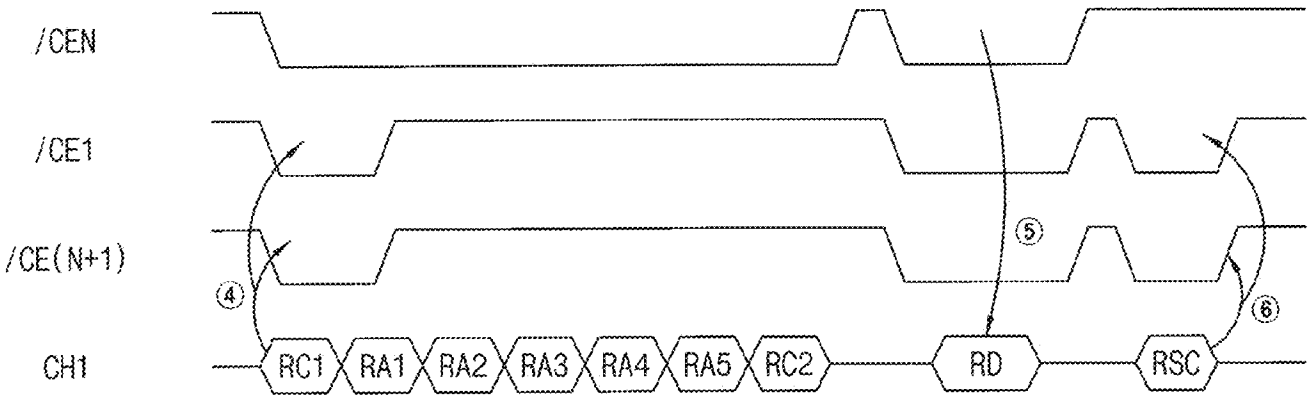

FIGS. 18A and 18B are timing diagrams for describing an operation of the nonvolatile memory device of FIG. 17. FIG. 18A illustrates an example of the data write operation, and FIG. 18B illustrates an example of the data read operation.

Operations of FIGS. 18A and 18B may be substantially the same as the operations of FIGS. 14A and 14B, respectively, except that the chip enable signal /CE1 applied to the first memory die 210a, the chip enable signal /CEN applied to the N-th memory die 210n and the chip enable signal /CE(N+1) applied to the (N+1)-th memory die 310a are separated from one another in FIGS. 18A and 18B. For example, a timing of the signal /CEN in FIGS. 18A and 18B may be substantially the same as a timing of the signal /CEN_AT_MDN in FIGS. 14A and 14B, and a timing of the signal /CE1 and /CE(N+1) in FIGS. 18A and 18B may be substantially the same as a timing of the signal /CE2N_AT_MD(N+1) in FIGS. 14A and 14B.

In the nonvolatile memory device described with reference to FIGS. 13, 15 and 17, an additional ODT control signal and/or an additional command for enabling or disabling the ODT mode may be unnecessary. Accordingly, the nonvolatile memory device may efficiently perform the ODT operation without increasing time required for accessing the nonvolatile memory device, and thus the nonvolatile memory device may have relatively enhanced or improved performance.

FIGS. 19A, 19B, 20A and 20B are cross-sectional views of a nonvolatile memory device according to example embodiments.

Referring to FIGS. 13, 15, 17 and 19A, a nonvolatile memory device according to example embodiments may be implemented as a multi-stacked chip package 60a.

The multi-stacked chip package 60a may include a base substrate 62, and a first memory structure 200a and a second memory structure 300a that are disposed on the base substrate 62. The multi-stacked chip package 60a may further include a plurality of I/O pads IOPAD1 and IOPAD2, a plurality of bonding wires BW1 and BW2, a sealing member 66, adhesive members 67 and conductive bumps 64. Each of the first memory structure 200a and the second memory structure 300a may have a structure (e.g., scalariformly stacked structure) described above with reference to FIG. 9. The first channel CH1 in FIGS. 13, 15 and 17 may be formed by the plurality of I/O pads IOPAD1 and IOPAD2 and the plurality of bonding wires BW1 and BW2.

Referring to FIGS. 13, 15, 17 and 19B, a nonvolatile memory device according to example embodiments may be implemented as a multi-stacked chip package 60b.

Figure 19A:
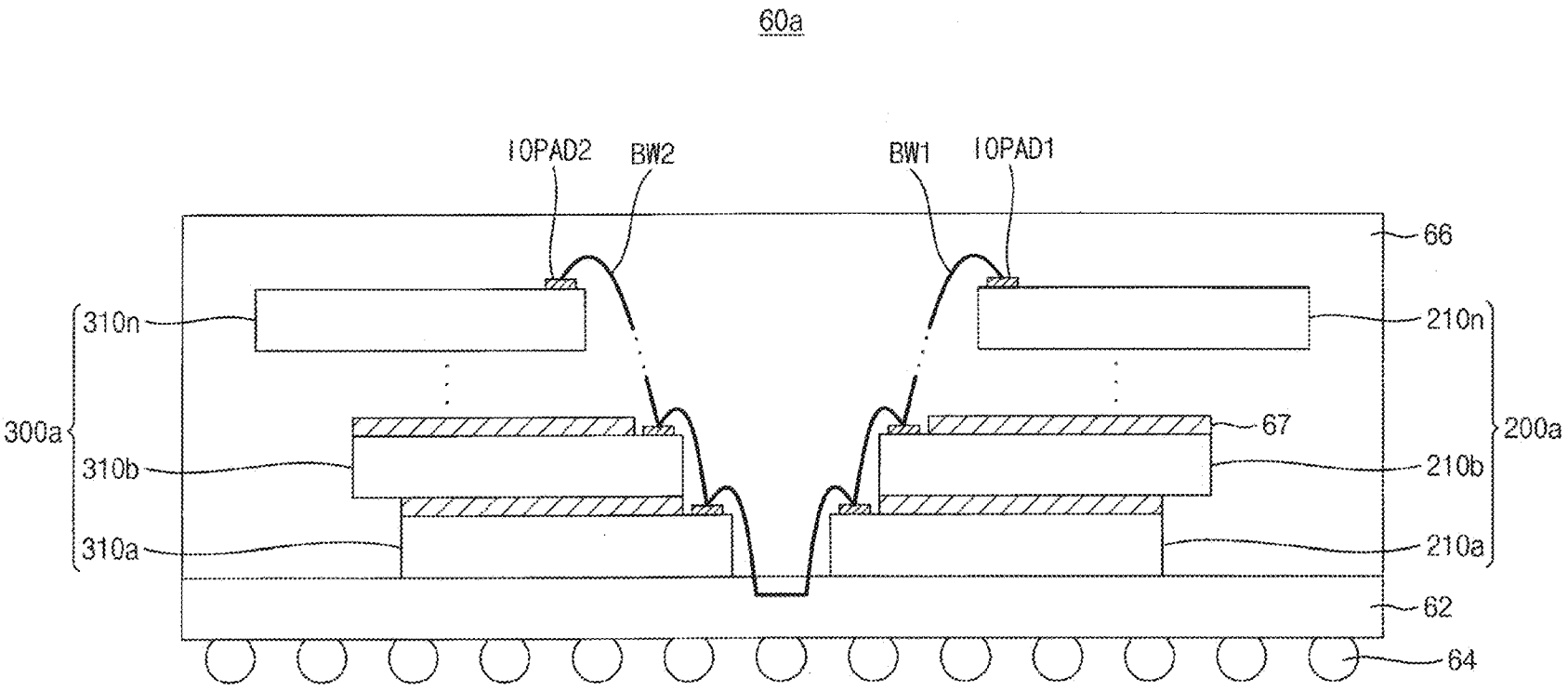
FIGS. 19A, 19B, 20A and 20B are cross-sectional views of a nonvolatile memory device according to example embodiments.
Figure 19B:
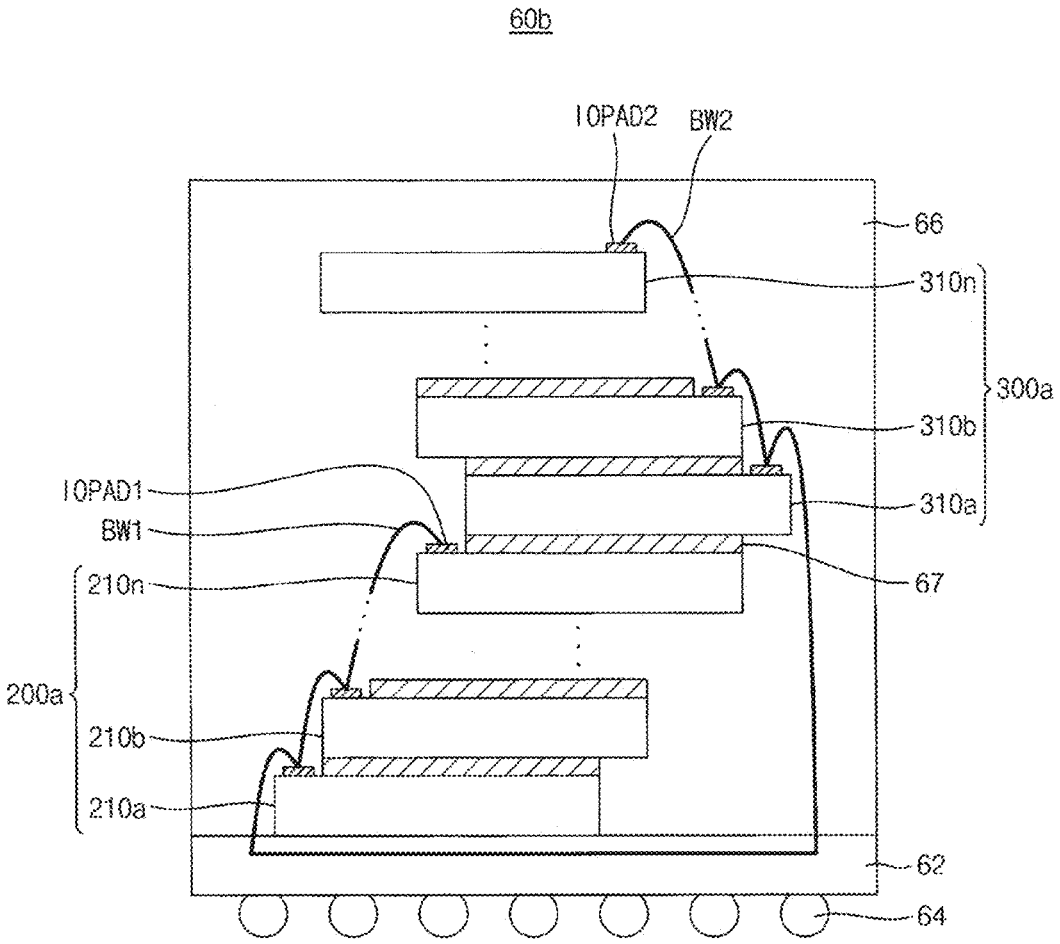

The multi-stacked chip package 60b of FIG. 19B may be substantially the same as the multi-stacked chip package 60a of FIG. 19A, except that the second memory structure 300a in FIG. 19B is stacked on the first memory structure 200a in FIG. 19B.

Referring to FIGS. 13, 15, 17 and 20A, a nonvolatile memory device according to example embodiments may be implemented as a multi-stacked chip package 60c.

The multi-stacked chip package 60c may include a base substrate 62, and a first memory structure 200a and a second memory structure 300a that are disposed on the base substrate 62. The multi-stacked chip package 60c may further include a plurality of TSVs 68a and 68b, conductive material 69, a sealing member 66 and conductive bumps 64. Each of the first memory structure 200a and the second memory structure 300a may have a structure (e.g., stacked structure) described above with reference to FIG. 10. The first channel CH1 in FIGS. 13, 15 and 17 may be formed by the plurality of TSVs 68a and 68b, the conductive material 69 and a wiring W in the base substrate 62 that electrically connects the TSVs 68a with the TSVs 68b.

Referring to FIGS. 13, 15, 17 and 20B, a nonvolatile memory device according to example embodiments may be implemented as a multi-stacked chip package 60d.

Figure 20A:
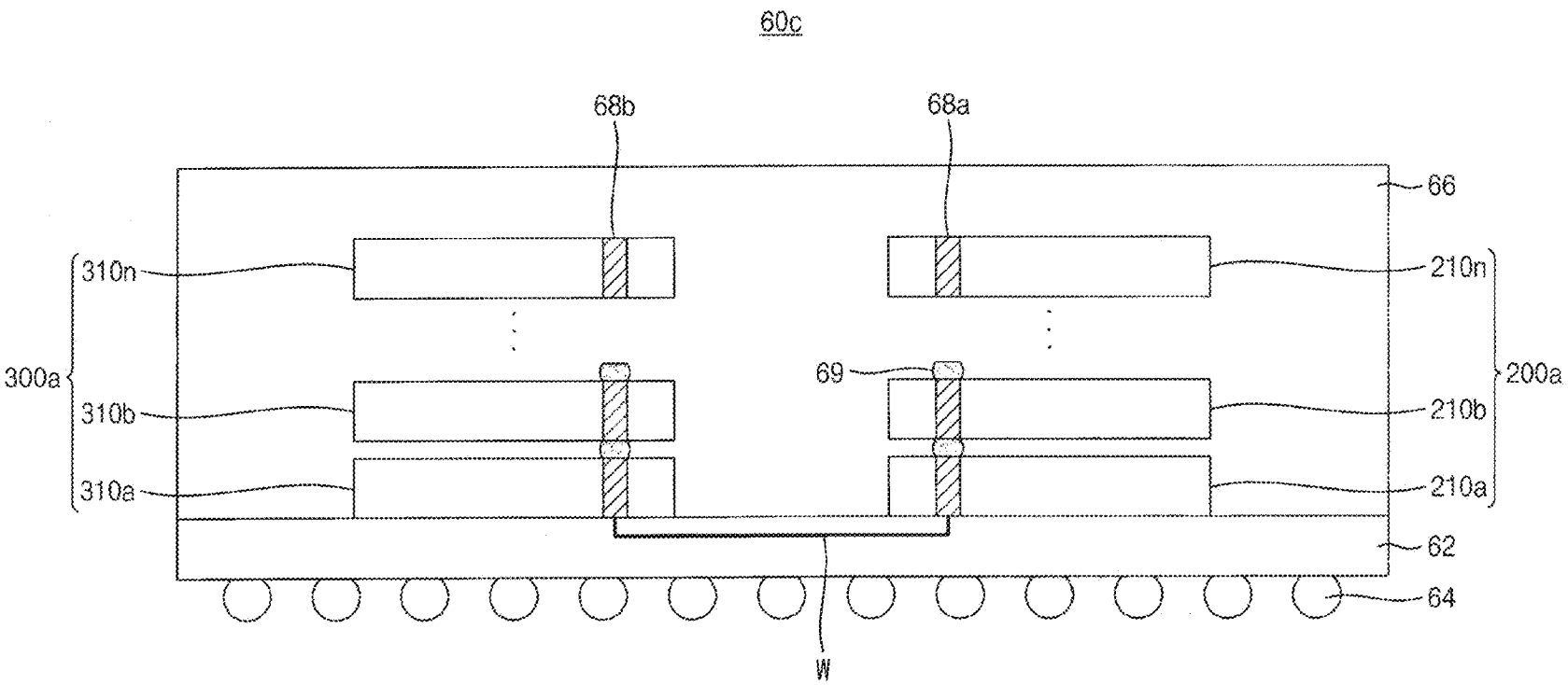
Figure 20B:
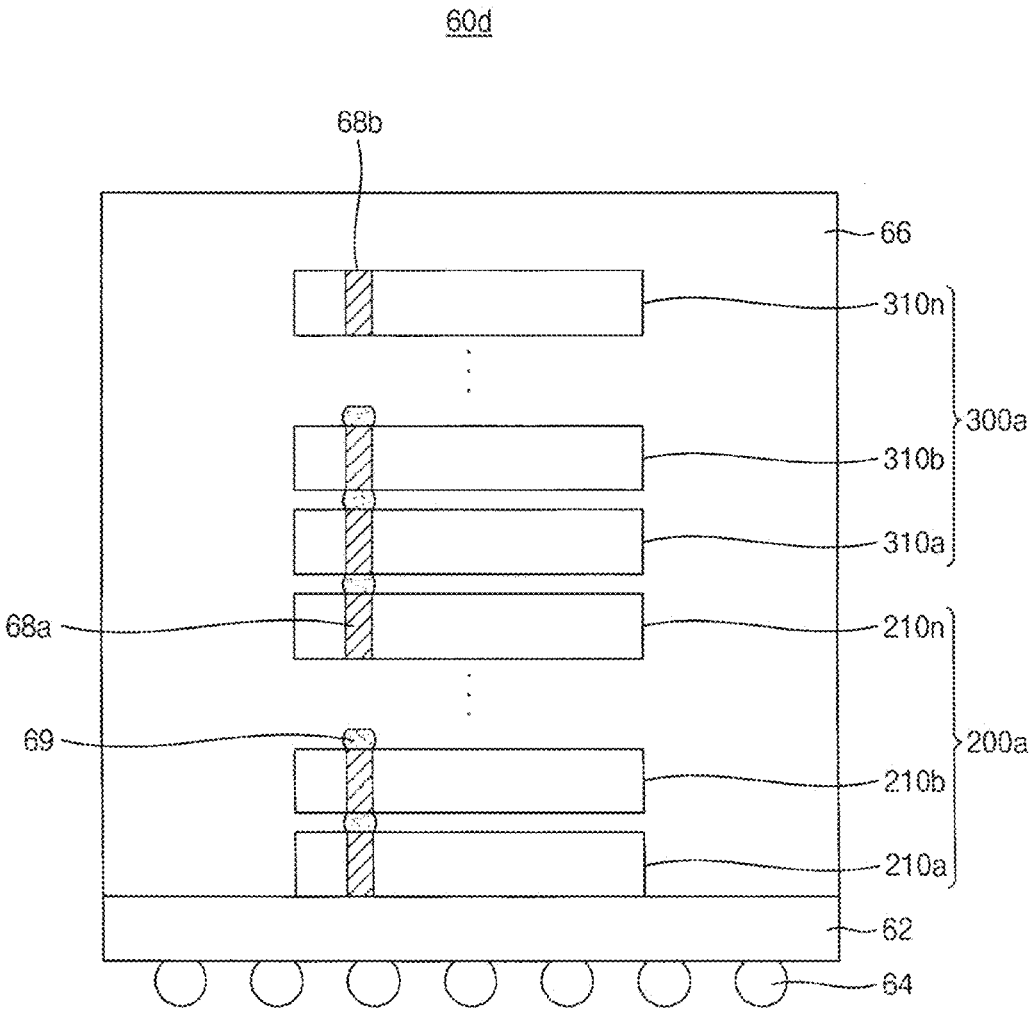

The multi-stacked chip package 60d of FIG. 20B may be substantially the same as the multi-stacked chip package 60c of FIG. 20A, except that the second memory structure 300a in FIG. 20B is stacked on the first memory structure 200a in FIG. 20B.

Figure 21:
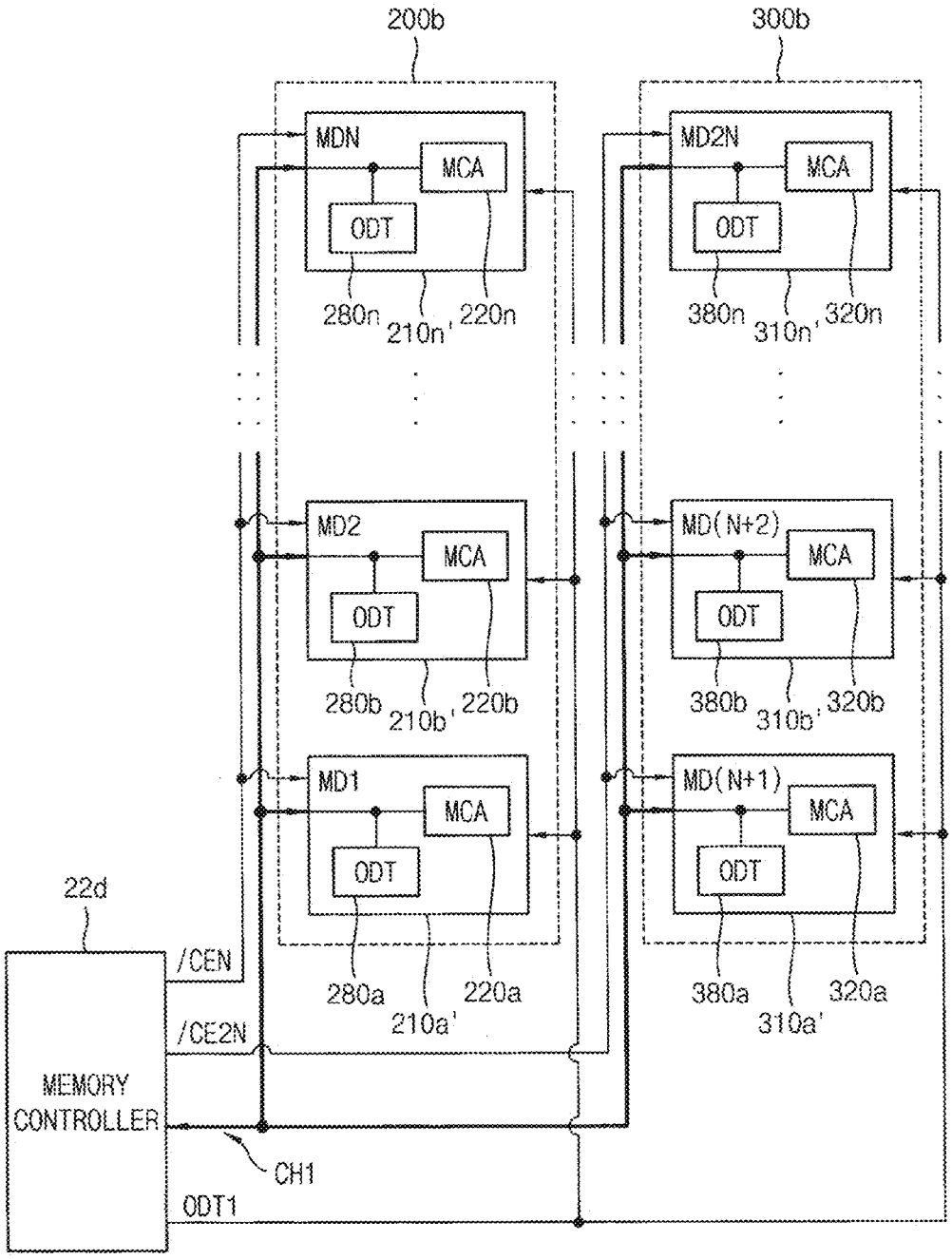
FIG. 21 is a block diagram illustrating a nonvolatile memory device according to example embodiments.

FIG. 21 is a block diagram illustrating a nonvolatile memory device according to example embodiments.

A nonvolatile memory device of FIG. 21 may be substantially the same as the nonvolatile memory device of FIG. 13, except that the nonvolatile memory device of FIG. 21 further includes a configuration for an ODT control signal.

Referring to FIG. 21, a nonvolatile memory device according to example embodiments includes a first memory structure 200b and a second memory structure 300b. The first memory structure 200b includes first through N-th memory dies 210a'~210n', and the second memory structure 300b includes (N+1)-th through 2N-th memory dies 310a', 310b', . . . , 310n'. The first through N-th memory dies 210a'~210n' may commonly receive a first chip enable signal /CEN from a memory controller 22d, and the (N+1)-th through 2N-th memory dies 310a'~310n' may commonly receive a second chip enable signal /CE2N from the memory controller 22d. In addition, the first through 2N-th memory dies 210a'~210n' and 310a'~310n' may commonly receive a first ODT control signal ODT1 from the memory controller 22d. In other words, in an example of FIG. 21, a single ODT control signal ODT1 may be shared by all of the memory dies 210a'~210n' and 310a'~310n'.

Figure 22A:
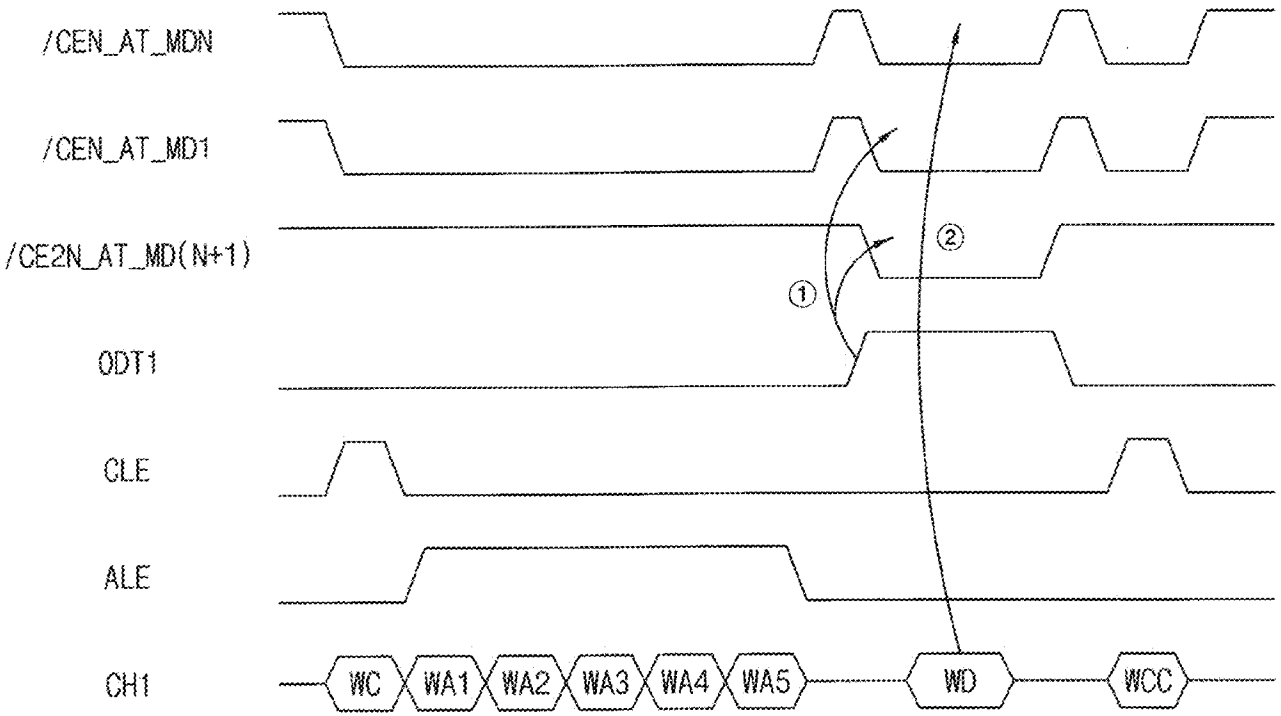
FIGS. 22A and 22B are timing diagrams for describing an operation of the nonvolatile memory device of FIG. 21.
Figure 22B:
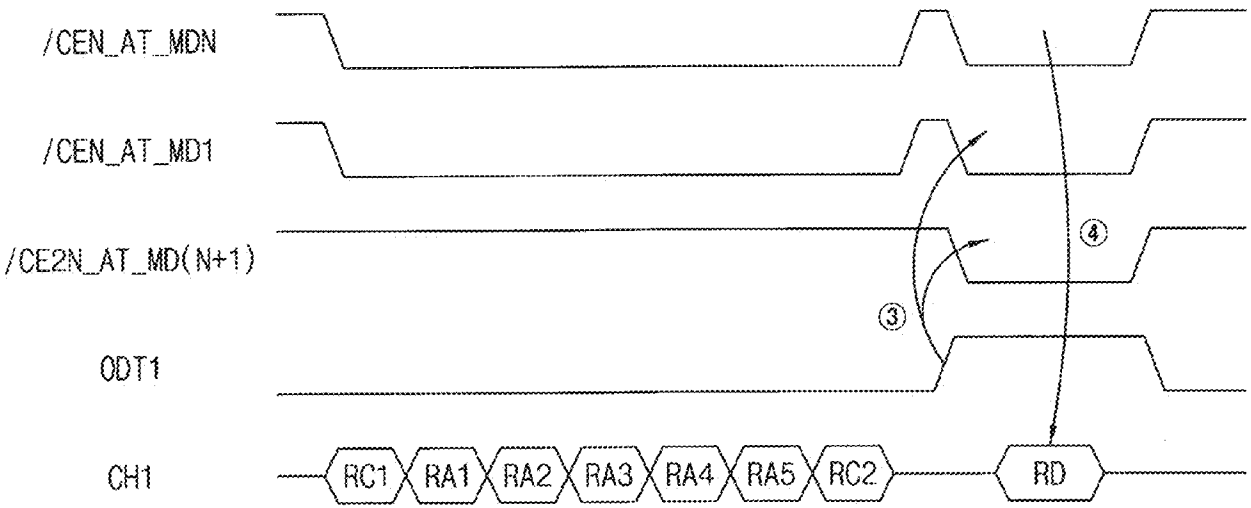

FIGS. 22A and 22B are timing diagrams for describing an operation of the nonvolatile memory device of FIG. 21. FIG. 22A illustrates an example of the data write operation, and FIG. 22B illustrates an example of the data read operation.

Operations of FIGS. 22A and 22B may be substantially the same as the operations of FIGS. 14A and 14B, respectively, except that the first ODT control signal ODT1 is further included in FIGS. 22A and 22B. A timing of the first ODT control signal ODT1 in FIGS. 22A and 22B may be substantially the same as a timing of the first ODT control signal ODT1 in FIGS. 12A and 12B.

Figure 23:
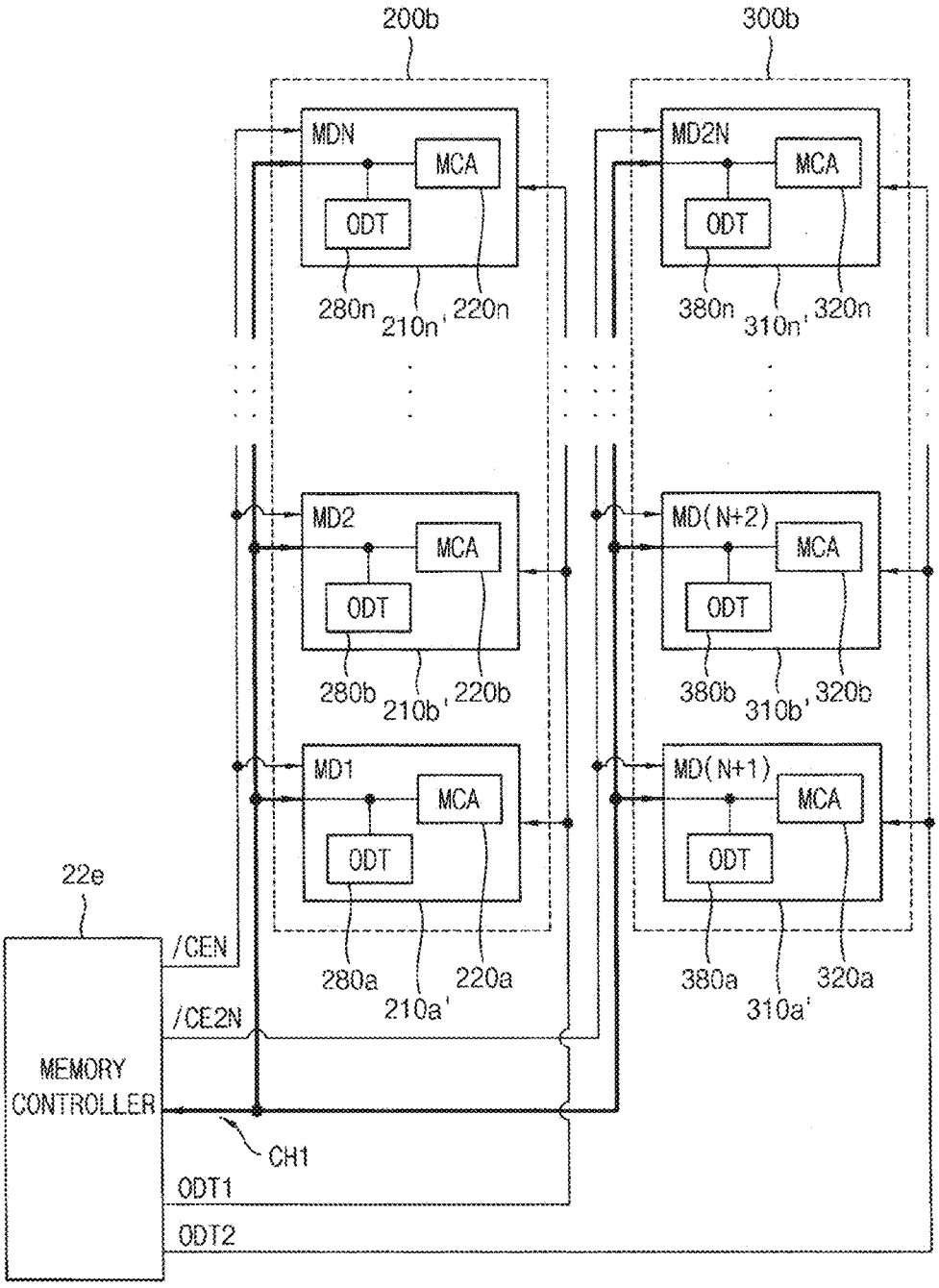
FIG. 23 is a block diagram illustrating a nonvolatile memory device according to example embodiments.

FIG. 23 is a block diagram illustrating a nonvolatile memory device according to example embodiments.

A nonvolatile memory device of FIG. 23 may be substantially the same as the nonvolatile memory device of FIG. 13, except that the nonvolatile memory device of FIG. 23 further includes a configuration for ODT control signals.

Referring to FIG. 23, a nonvolatile memory device according to example embodiments includes a first memory structure 200b and a second memory structure 300b. The first memory structure 200b includes first through N-th memory dies 210a'~210n', and the second memory structure 300b includes (N+1)-th through 2N-th memory dies 310a'~310n'. The first through N-th memory dies 210a'~210n' may commonly receive a first chip enable signal /CEN and a first ODT control signal ODT1 from a memory controller 22e. The (N+1)-th through 2N-th memory dies 310a'~310n' may commonly receive a second chip enable signal /CE2N and a second ODT control signal ODT2 from the memory controller 22e. In other words, in an example of FIG. 23, a single chip enable signal (e.g., /CEN) and a single ODT control signal (e.g., ODT1) may be shared by the memory dies (e.g., 210a'~210n') included in a single memory structure (e.g., memory structure 200b). In addition, the ODT control signals ODT1 and ODT2 applied to the memory structure 200b and 300b may be split up or separated from each other, and the number of the ODT control signals ODT1 and ODT2 may be substantially the same as the number of the memory structure 200b and 300b.

Figure 24A:
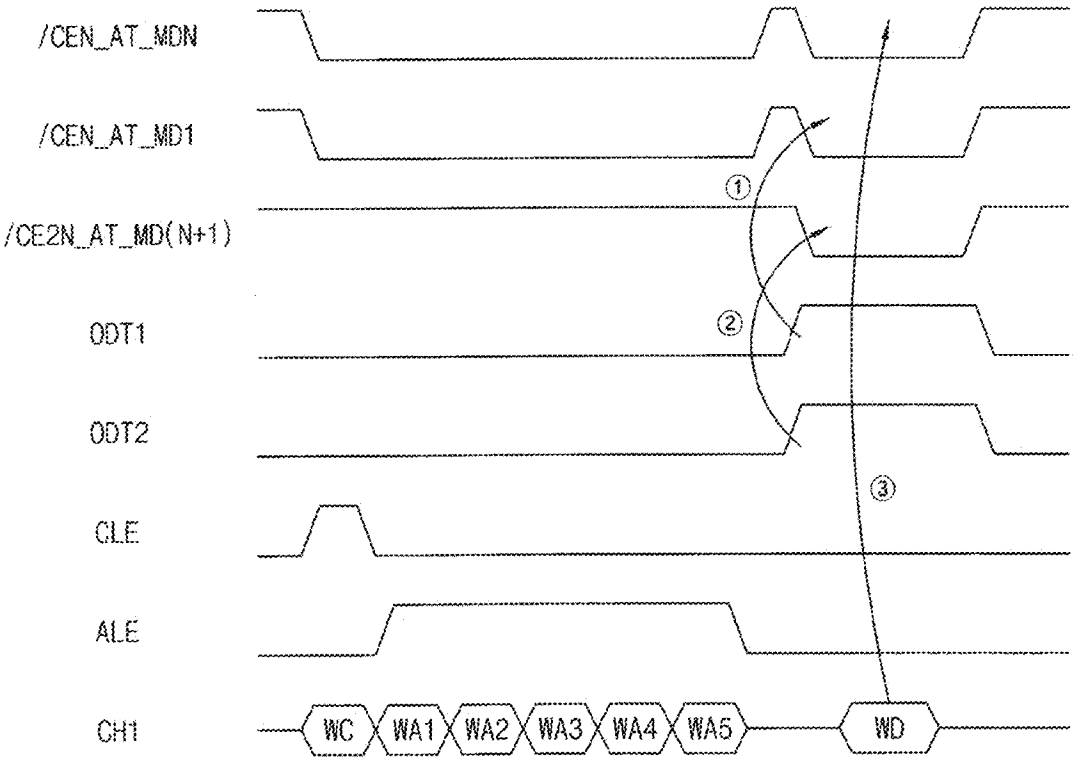
FIGS. 24A and 24B are timing diagrams for describing an operation of the nonvolatile memory device of FIG. 23.
Figure 24B:
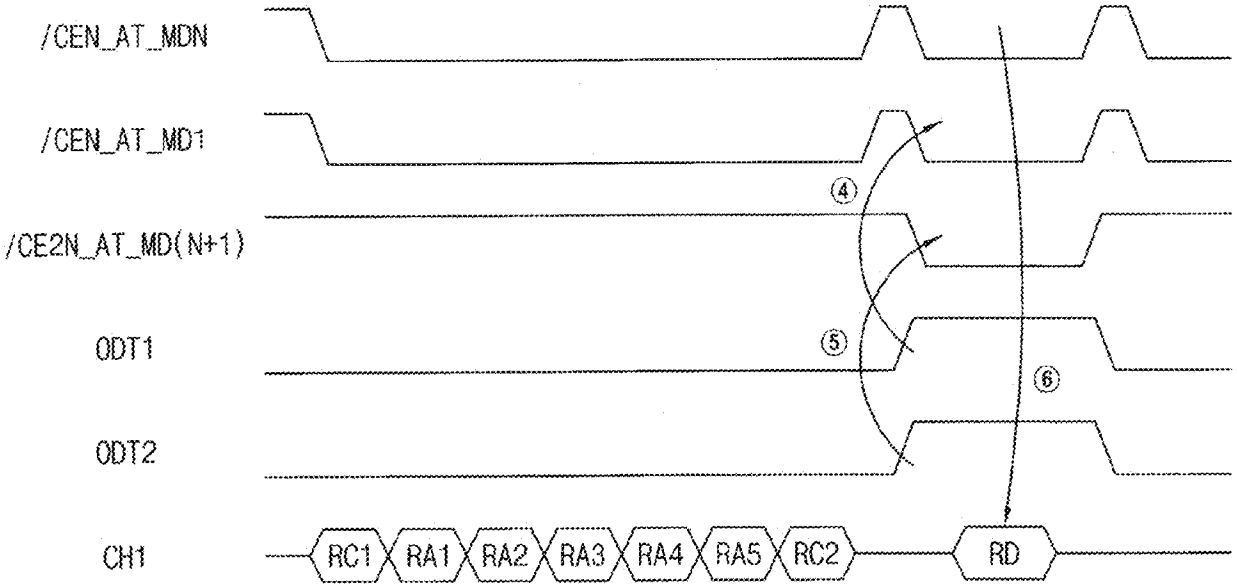

FIGS. 24A and 24B are timing diagrams for describing an operation of the nonvolatile memory device of FIG. 23. FIG. 24A illustrates an example of the data write operation, and FIG. 24B illustrates an example of the data read operation.

Operations of FIGS. 24A and 24B may be substantially the same as the operations of FIGS. 14A and 14B, respectively, except that the first and second ODT control signals ODT1 and ODT2 are further included in FIGS. 24A and 24B. Each of timings of the first and second ODT control signals ODT1 and ODT2 in FIGS. 24A and 24B may be substantially the same as a timing of the first ODT control signal ODT1 in FIGS. 12A and 12B.

In the nonvolatile memory device described with reference to FIGS. 22 and 24, an additional command for enabling or disabling the ODT mode may be unnecessary. In addition, each of the ODT control signals ODT1 and ODT2 may be shared by a plurality of memory dies, and thus wirings or signal lines for receiving the ODT control signals ODT1 and ODT2 may have relatively simple structure in the nonvolatile memory device of FIGS. 22 and 24.

Although FIGS. 22 and 24 illustrate examples where the memory dies included in a single memory structure commonly receive a single ODT chip enable signal, chip enable signals applied to the memory dies included in a single memory structure may be split up or separated from one another, as described with reference to FIGS. 15 and 17.

Although FIGS. 14A, 14B, 16A, 16B, 18A, 18B, 22A, 22B, 24A and 24B illustrate examples where the N-th memory die is the target die, the first memory die is the first representative die and the (N+1)-th memory die is the second representative die, the target die may be a P-th memory die, the first representative die may be an I-th memory die, and the second representative die may be a J-th memory die, where P is a natural number equal to or less than one and equal to or greater than 2N, I is a natural number equal to or less than one and equal to or greater than N, and J is a natural number equal to or less than (N+1) and equal to or greater than 2N. In addition, in some example embodiments, more than two memory dies may be configured to be used (and/or alternatively predetermined) as the first representative die and/or the second representative die.

Figure 25:
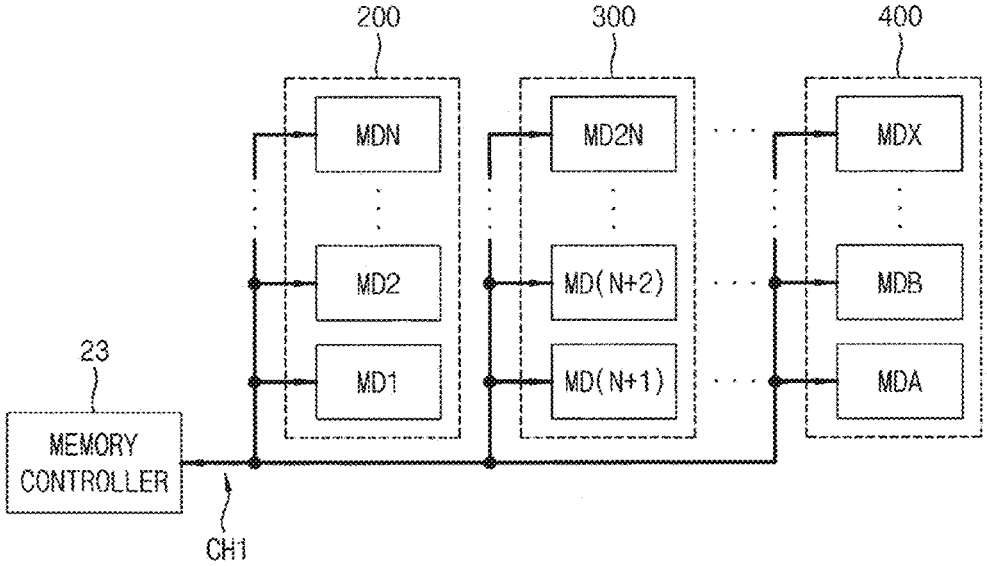
FIG. 25 is a block diagram illustrating a nonvolatile memory device according to example embodiments.

FIG. 25 is a block diagram illustrating a nonvolatile memory device according to example embodiments.

Referring to FIG. 25, a nonvolatile memory device according to example embodiments includes a plurality of memory structures 200, 300 and 400. The memory structure 200 includes a plurality of memory dies MD1, MD2, . . . , MDN, the memory structure 300 includes a plurality of memory dies MD(N+1), MD(N+2), . . . , MD2N, and the memory structure 400 includes a plurality of memory dies MDA, MDB, . . . , MDX. Each of the memory dies MD1~MDN, MD(N+1)~MD2N and MDA~MDX may receive a chip enable signal and may further receive an ODT control signal. A single chip enable signal and/or a single ODT control signal may be shared by a plurality of memory dies, or separated chip enable signals and/or separated ODT control signals may be provided to a plurality of memory dies. Each of the memory structures 200, 300 and 400 may be implemented as a multi-stacked chip package such that the memory dies (e.g., MD1~MDN in 200) are sequentially stacked on one another.

Figure 26:
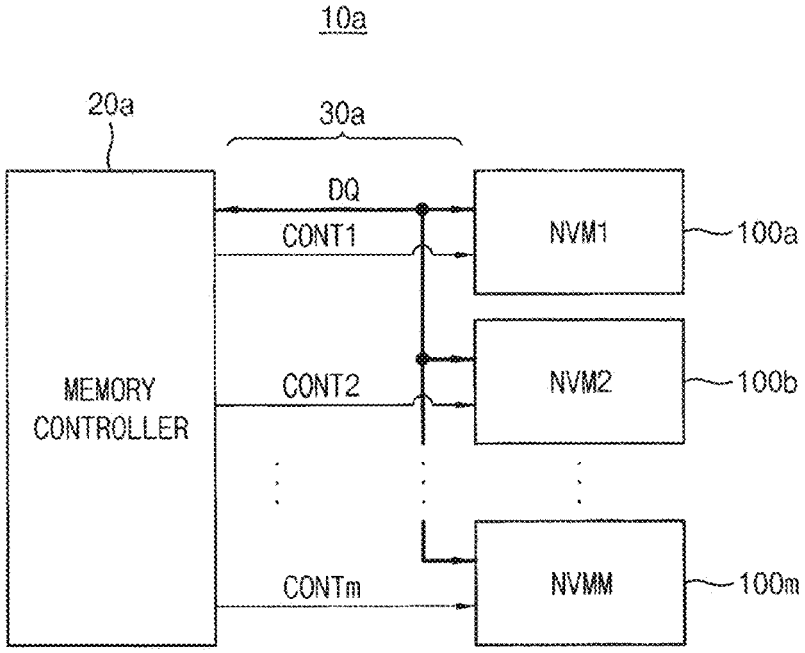
FIGS. 26 and 27 are block diagrams illustrating a memory system according to example embodiments.
Figure 27:
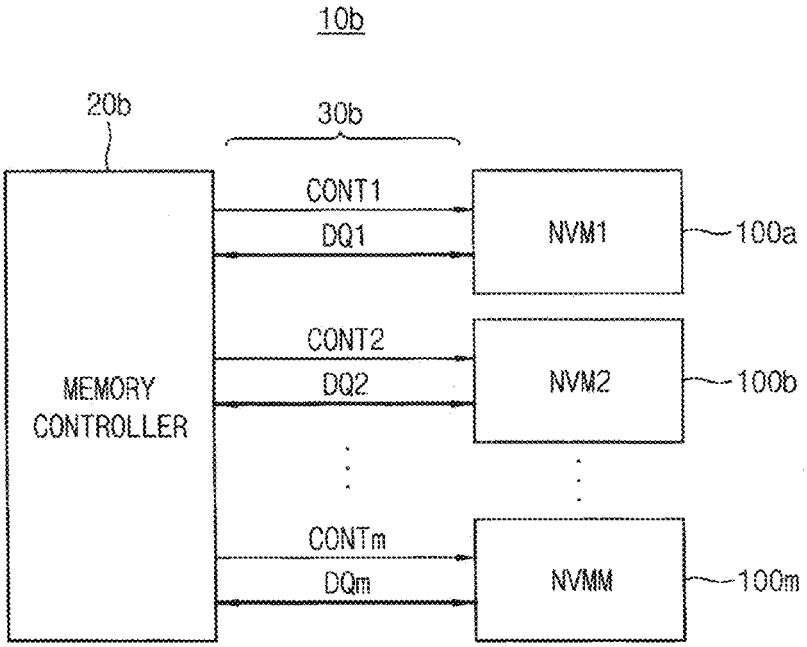

FIGS. 26 and 27 are block diagrams illustrating a memory system according to example embodiments.

Referring to FIG. 26, a memory system 10a includes a memory controller 20a and a plurality of nonvolatile memory devices 100a, 100b, . . . , 100m. The memory system 10a may further include a plurality of signal lines 30a that electrically connect the memory controller 20a with the nonvolatile memory devices 100a~100m.

Each of the nonvolatile memory devices 100a~100m is controlled by the memory controller 20a. The plurality of signal lines 30a may include control signal lines for transmitting control signals CONT1, CONT2, . . . , CONTm and data I/O lines for exchanging data DQ. The data I/O lines may form a single channel.

Each of the nonvolatile memory devices 100a~100m may be a nonvolatile memory devices according to example embodiments. In some example embodiments, each of the nonvolatile memory devices 100a~100m may be implemented based on the examples of FIGS. 2, 7 and 11, the examples of FIGS. 13, 15, 17, 21 and 23, or the example of FIG. 25. In some example embodiments, each of the nonvolatile memory devices 100a~100m may be implemented as a multi-stacked chip package.

Referring to FIG. 27, a memory system 10b includes a memory controller 20b and a plurality of nonvolatile memory devices 100a~100m. The memory system 10b may further include a plurality of signal lines 30b that electrically connect the memory controller 20b with the nonvolatile memory devices 100a~100m.

Each of the nonvolatile memory devices 100a~100m is controlled by the memory controller 20b. The plurality of signal lines 30b may include control signal lines for transmitting control signals CONT1~CONTm and data I/O lines for exchanging data DQ1, DQ2, . . . , DQm. The data I/O lines may form a plurality of channels.

In an example of FIG. 26, the nonvolatile memory devices 100a~100m may be connected to the memory controller 20a via a single channel. In an example of FIG. 27, each of the nonvolatile memory devices 100a~100m may be connected to the memory controller 20b via a single channel. Each representative die of a single memory structure included in a respective one of the nonvolatile memory devices 100a~100m may perform the ODT operation during the data write operation or the data read operation. In the memory system according to example embodiments, an additional ODT control signal and/or an additional command for enabling or disabling the ODT mode may be unnecessary, or an ODT control signal may be shared by a plurality of memory dies even if the additional ODT control signal is necessary. Accordingly, the nonvolatile memory devices 100a~100m and memory systems 10a and 10b including the nonvolatile memory devices 100a~100m may have relatively enhanced or improved performance.

Figure 28:
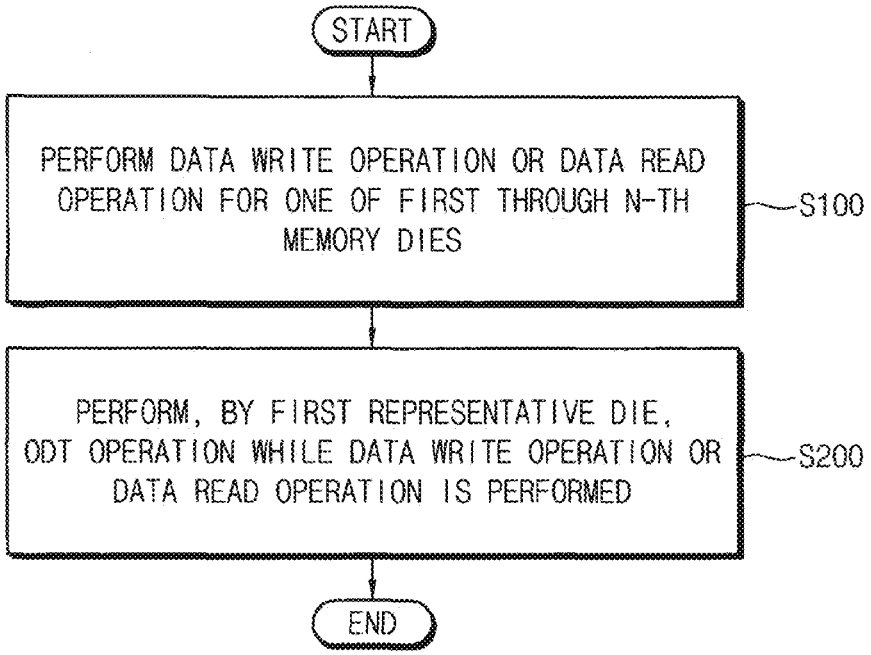
FIG. 28 is a flow chart illustrating a method of operating a nonvolatile memory device according to example embodiments.

FIG. 28 is a flow chart illustrating a method of operating a nonvolatile memory device according to example embodiments.

Referring to FIGS. 2 and 28, the nonvolatile memory device includes a first memory structure 200a that includes first through N-th memory dies 210a~210n. The first through N-th memory dies 210a~210n are connected to an external memory controller via a first channel CH1. In a method of operating the nonvolatile memory device, a data write operation or a data read operation is performed for one of the first through N-th memory dies 210a~210n (operation S100). While the data write operation or the data read operation is performed, an ODT operation is performed by a first representative die (operation S200). At least one of the first through N-th memory dies 210a~210n is configured to be used (and/or alternatively predetermined) as the first representative die.

Figure 29:
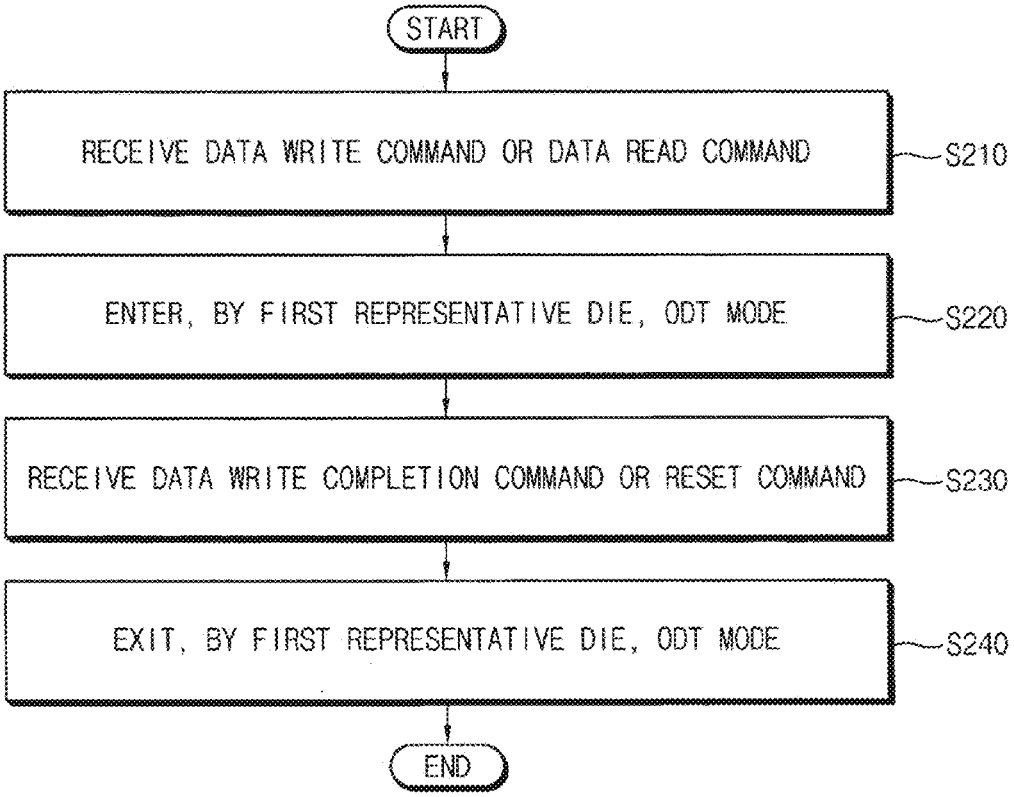
FIGS. 29 and 30 are flow charts illustrating an example of performing an ODT operation in FIG. 28.
Figure 30:
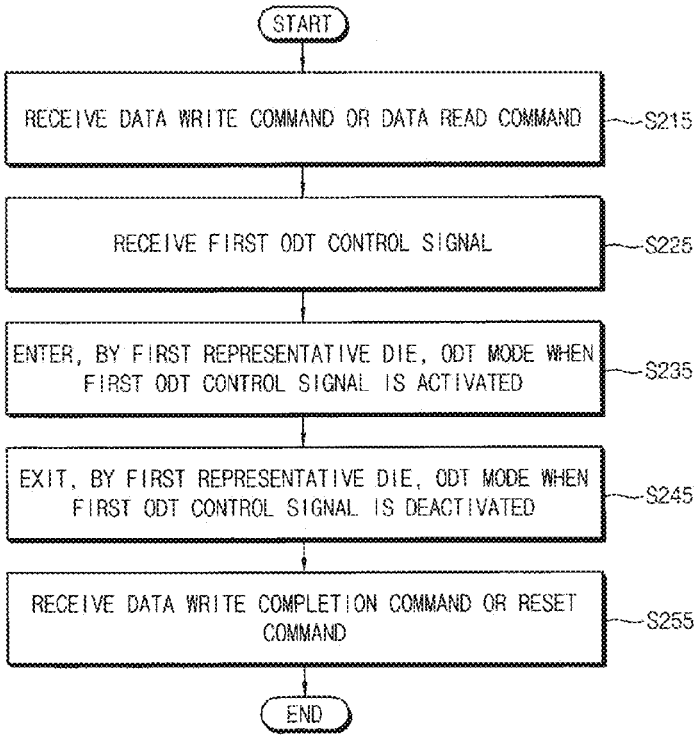

FIGS. 29 and 30 are flow charts illustrating an example of performing an ODT operation in FIG. 28.

Referring to FIGS. 2, 6A, 6B, 28 and 29, in operation S200, a data write command WC or a data read command RC1 may be received via the first channel CH1 (operation S210). The first representative die (e.g., the first memory die 210a) may enter an ODT mode based on the data write command WC or the data read command RC1 (operation S220). The first representative die may perform the ODT operation while write data WD is stored into the nonvolatile memory device or read data RD is output from the nonvolatile memory device. When a storage of the write data WD or an output of the read data RD is completed, a data write completion command WCC or a reset command RSC may be received via the first channel CH1 (operation S230). The first representative die may exit the ODT mode based on the data write completion command WCC the a reset command RSC (operation S240).

Referring to FIGS. 2, 12A, 12B, 28 and 30, in operation S200, a data write command WC or a data read command RC1 may be received via the first channel CH1 (operation S215). A first ODT control signal ODT1 may be received (operation S225). When the first ODT control signal ODT1 is activated, the first representative die may enter an ODT mode (operation S235). The first representative die may perform the ODT operation while write data WD is stored into the nonvolatile memory device or read data RD is output from the nonvolatile memory device. When a storage of the write data WD or an output of the read data RD is completed, and when the first ODT control signal ODT1 is deactivated, the first representative die may exit the ODT mode (operation S245). After then, a data write completion command WCC or a reset command RSC may be received via the first channel CH1 (operation S255).

The present disclosure may be applied to various devices and systems that include the nonvolatile memory device. For example, the present disclosure may be applied to systems such as be a mobile phone, a smart phone, a personal digital assistants (PDA), a portable multimedia player (PMP), a digital camera, a camcorder, a personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and features of inventive concepts. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A nonvolatile memory device comprising:

a first memory structure including first through N-th memory dies configured to be connected to an external memory controller via a first channel, where N is a natural number equal to or greater than two, at least one of the first through N-th memory dies being configured to be used as a first representative die that performs an on-die termination (ODT) operation while a data write operation is performed for a different one of the first through N-th memory dies rather than the first representative die, wherein the first representative die is configured to enter an ODT mode to perform the ODT operation instead of the data write operation if a data write command is received from the external memory controller via the first channel and the different one of the first through N-th memory dies is a target die for the data write operation.

2. The nonvolatile memory device of claim 1, wherein the first through N-th memory dies are configured to commonly receive a first chip enable signal from the external memory controller, and the first memory structure is configured to perform the data write operation and the ODT operation if first chip enable signal is activated.

3. [A] *The* nonvolatile memory device [comprising:] *of claim 1, wherein*

[a first memory structure including first through N-th memory dies configured to be connected to an external memory controller via a first channel, where N is a natural number equal to or greater than two,]

[at least one of the first through N-th memory dies being configured to be used as a first representative die that performs an on-die termination (ODT) operation while a data write operation is performed for one of the first through N-th memory dies,]

[wherein the first representative die is configured to enter an ODT mode to perform the ODT operation if a data write command is received from the external memory controller via the first channel,]

each of the first through N-th memory dies is configured to receive a respective one of first through N-th chip enable signals from the external memory controller, the first memory structure is configured to perform the data write operation for a K-th memory die if a K-th chip enable signal is activated, K is a natural number equal to or less than N, and equal to or greater than one, the first memory structure is configured to perform the ODT operation if an Lth chip enable signal is activated, L is a natural number equal to or less than N, and equal to or greater than one, an L-th memory die is the at least one of the first through N-th memory dies configured to be used as the first representative die, and the L-th memory die is configured to perform the ODT operation based on the activated L-th chip enable signal.

4. The nonvolatile memory device of claim 1, wherein the first representative die is configured to exit the ODT mode when a data write completion command is received from the external memory controller via the first channel after the data write operation is performed based on the data write command.

5. The nonvolatile memory device of claim 1, wherein the first through N-th memory dies are configured to commonly receive a first ODT control signal from the external memory controller, and the first representative die is configured to enter [an] *the* ODT mode and perform the ODT operation when [a] *the* data write command is received from the external memory controller via the first channel, and when the first ODT control signal is activated.

6. The nonvolatile memory device of claim 1, wherein the first through N-th memory dies are sequentially stacked on one another.

7. The nonvolatile memory device of claim 6, wherein each of the first through N-th memory dies includes input/output (I/O) pads arranged near one side of each memory die, the first through N-th memory dies are stacked in a step shape such that the I/O pads of each memory chip are exposed, and the first through N-th memory dies are electrically connected to one another via the I/O pads.

8. The nonvolatile memory device of claim 6, wherein each of the first through N-th memory dies includes through silicon vias (TSVs), and the first through N-th memory dies are electrically connected to one another via the TSVs.

9. The nonvolatile memory device of claim 1, wherein the first representative die is configured to perform the ODT operation while a data read operation is performed for an other one of the first through N-th memory dies.

10. The nonvolatile memory device of claim 1, further comprising:

a second memory structure including (N+1)-th through 2N-th memory dies connected to the external memory controller via the first channel, wherein at least one of the (N+1)-th through 2N-th memory dies is configured to be used as a second representative die that performs that ODT operation while the data write operation is performed.

11. The nonvolatile memory device of claim 10, wherein the first representative die and the second representative die are configured to enter the ODT mode to perform the ODT operation when the data write command is received from the external memory controller via the first channel.

12. The nonvolatile memory device of claim 11, wherein the first through N-th memory dies are configured to commonly receive a first chip enable signal from the external memory controller, the (N+1)-th through 2N-th memory dies are configured to commonly receive a second chip enable signal from the external memory controller, the target die for the data write operation includes a first target die and a second target die, the first target die is the different one of the first through N-th memory dies, the second target die is one of the (N+1)-th through 2N-th memory dies, the first target die and the second target die are configured to perform the data write operation and the first and second representative dies are configured to perform the ODT operation when the first chip enable signal and the second chip enable signal are activated.

13. The nonvolatile memory device of claim 11, wherein each of the first through N-th memory dies is configured to receive a respective one of first through N-th chip enable signals from the external memory controller, each of the (N+1)-th through 2N-th memory dies is configured to receive a respective one of the first through N-th chip enable signals from the external memory controller, the first memory structure is configured to perform the data write operation for a K-th memory die if a K-th chip enable signal is activated, K is a natural number equal to or less than one and equal to or greater than N, the first memory structure and the second memory structure are configured to perform the ODT operation if an I-th chip enable signal and a (J–N)-th chip enable signal are activated, I is a natural number equal to or less than one and equal to or greater than N, J is a natural number equal to or less than (N+1) and equal to or greater than 2N, an I-th memory die is the at least one of the first through N-th memory dies configured to be used as the first representative die and a J-th memory die is the at least one of the (N+1)-th through 2N-th memory dies configured to be used as the second representative die, and the I-th memory die and the J-th memory die are configured to perform the ODT operation based on the activated I-th and (J–N)-th chip enable signals, respectively.

14. The nonvolatile memory device of claim 11, wherein each of the first through N-th memory dies is configured to receive a respective one of first through N-th chip enable signals from the external memory controller, each of the (N+1)-th through 2N-th memory dies is configured to receive a respective one of (N+1)-th through 2N-th chip enable signals from the external memory controller, a K-th chip enable signal is activated to perform the data write operation for a K-th memory die, where K is a natural number equal to or less than one and equal to or greater than N, an I-th chip enable signal and a J-th chip enable signal are activated to perform the ODT operation, where I is a natural number equal to or less than one and equal to or greater than N, where and J is a natural number equal to or less than (N+1) and equal to or greater than 2N, an I-th memory die is configured to be used as the first representative die and a J-th memory die is configured to be used as the second representative die perform the ODT operation based on the activated I-th and J-th chip enable signals, respectively.

15. The nonvolatile memory device of claim 10, wherein the first through 2N-th memory dies are configured to commonly receive a first ODT control signal from the external memory controller, and the first representative die and the second representative die are configured to enter [an] *the* ODT mode to perform the ODT operation when [a] *the* data write command is received from the external memory controller via the first channel, and when the first ODT control signal is activated.

16. The nonvolatile memory device of claim 10, wherein the first through N-th memory dies are configured to commonly receive a first ODT control signal from the external memory controller, the (N+1)-th through 2N-th memory dies are configured to commonly receive a second ODT control signal from the external memory controller, and the first representative die and the second representative die are configured to enter [an] *the* ODT mode to perform the ODT operation when [a] *the* data write command is received from the external memory controller via the first channel, and when the first ODT control signal and the second ODT control signal are activated.

17. A memory system comprising:

the nonvolatile memory device of claim 1; and a memory controller, wherein the memory controller is the external memory controller, the nonvolatile memory device is a first nonvolatile memory device, the first nonvolatile memory device is configured to be controlled by the memory controller such that the first memory structure includes the first through N-th memory dies and the first through N-th memory dies are connected to the memory controller via the first channel, the first representative die is configured to perform the ODT operation while a data read operation is performed for an other one of the first through N-th memory dies.

18. The memory system of claim 17, further comprising:

a second nonvolatile memory device configured to be controlled by the memory controller, the second nonvolatile memory device including a second memory structure, the second memory structure including first through M-th memory dies connected to the memory controller via the first channel, M being a natural number equal to or greater than two, at least one of the first through M-th memory dies in the second memory structure being configured to be used as a second representative die that performs the ODT operation while the data write operation is performed.

19. A method of operating a nonvolatile memory device including a first memory structure including first through N-th memory dies configured to be connected to an external memory controller via a first channel, where N is a natural number equal to or greater than two, the method comprising:

performing a data write operation or a data read operation for one of the first through N-th memory dies; and performing an on-die termination (ODT) operation while the data write operation or the data read operation is performed, the performing the ODT operation including using at least one of the first through N-th memory dies as a first representative die to perform the ODT operation while the data write operation or the data read operation is performed on a different one of the first through N-th memory dies rather the first representative die, the first representative die being configured to enter an ODT mode to perform the ODT operation in response to receiving a data write command from the external memory controller via the first channel and the different one of the first through N-th memory dies being a target die for the data write operation.

*20. The nonvolatile memory device of claim 1, wherein the external memory controller is configured to generate a setting signal for setting one of the first through N-th memory dies to the first representative die.*

*21. A nonvolatile memory device comprising:*

*a first memory structure including first through N-th memory dies connected to an external memory controller via a first channel, where N is a natural number greater than or equal to two,*

*wherein at least one of the first through N-th memory dies in the first memory structure is designated as a first representative die that performs an on-die termination (ODT) operation while a first data write operation is performed for a different one of the first through N-th memory dies rather than the first representative die,*

*wherein the first representative die is configured to turn on an ODT mode to perform the ODT operation when an ODT control signal received through an ODT pin is activated regardless of chip selection, and the first representative die enters the ODT mode to perform the ODT operation instead of the first data write operation when the first memory structure receives a first data write command from the external memory controller via the first channel and the different one of the first through N-th memory dies is a target die for the first data write operation.*

*22. The nonvolatile memory device of claim 21, wherein the ODT control signal is shared by the first through N-th memory dies in the first memory structure.*

*23. The nonvolatile memory device of claim 21, wherein the ODT control signal is different from a command signal received through a command pin and an address signal received through an address pin.*

*24. The nonvolatile memory device of claim 21, wherein the ODT operation performed by the first representative die is an other-termination operation.*

*25. The nonvolatile memory device of claim 21, wherein the first through N-th memory dies are sequentially stacked on one another.*

*26. The nonvolatile memory device of claim 25, wherein each of the first through N-th memory dies includes input/output (I/O) pads arranged near one side of each memory die,*

*the first through N-th memory dies are stacked in a step shape such that the I/O pads of each memory chip are exposed, and*

*the first through N-th memory dies are electrically connected to one another via the I/O pads and bonding wires.*

*27. The nonvolatile memory device of claim 25, wherein each of the first through N-th memory dies includes through silicon vias (TSVs), and*

*the first through N-th memory dies are electrically connected to one another via the TSVs.*

*28. The nonvolatile memory device of claim 21, wherein each of all of the first through N-th memory dies includes an ODT circuit.*

*29. The nonvolatile memory device of claim 28, wherein the ODT circuit includes:*

*a pull-up unit including a first switch and a first termination resistor that are connected in series between a first power supply voltage and a first node; and*

*a pull-down unit including a second switch and a second termination resistor that are connected in series between a second power supply voltage and the first node, the second power supply voltage being different from the first power supply voltage, and*

*wherein the first node is connected to an I/O pad, an input terminal of an input buffer and an output terminal of an output buffer.*

*30. The nonvolatile memory device of claim 28, wherein the ODT circuit includes:*

*a pull-up unit including a third switch and a third termination resistor that are connected in series between a first power supply voltage and a first node, and*

*wherein the first node is connected to an I/O pad, an input terminal of an input buffer and an output terminal of an output buffer.*

*31. The nonvolatile memory device of claim 30, wherein the ODT circuit includes:*

*a pull-down unit including a fourth switch and a fourth termination resistor that are connected in series between a second power supply voltage and a first node, and*

*wherein the first node is connected to an I/O pad, an input terminal of an input buffer and an output terminal of an output buffer.*

*32. The nonvolatile memory device of claim 21, wherein the first through N-th memory dies are configured to commonly receive a first chip enable signal from the external memory controller.*

*33. The nonvolatile memory device of claim 21, wherein each of the first through N-th memory dies is configured to receive a respective one of first through N-th chip enable signals from the external memory controller.*

*34. A nonvolatile memory device comprising:*

*a first memory structure including first through N-th memory dies connected to an external memory controller via a first channel, where N is a natural number greater than or equal to two,*

*wherein at least one of the first through N-th memory dies in the first memory structure is designated as a first representative die that performs an on-die termination (ODT) operation while a first data write operation is performed for a different one of the first through N-th memory dies rather than the first representative die,*

*wherein all the first through N-th memory dies are configured to perform the ODT operation when an ODT control signal received through an ODT pin is activated, and the first representative die enters an ODT mode to perform the ODT operation instead of the first data write operation when the first memory structure receives a first data write command from the external memory controller via the first channel and the different one of the first through N-th memory dies is a target die for the data write operation,*

*wherein the first representative die is configured to perform the ODT operation while the first data write operation is performed for the target die, and*

*the target die is another of the first through N-th memory dies.*

*35. The nonvolatile memory device of claim 34, wherein the first through N-th memory dies are sequentially stacked on one another.*

*36. A storage device comprising:*

*a memory controller; and*

*at least one nonvolatile memory device controlled by the memory controller, the nonvolatile memory device comprising:*

*a first memory structure including first through N-th memory chips connected to the memory controller via a first channel, where N is a natural number greater than or equal to two,*

*wherein at least one of the first through N-th memory chips in the first memory structure is designated as a first representative chip that performs an on-die termination operation (ODT) while a first data write opera-*

*tion is performed for a different one of the first through N-th memory chips rather than the first representative chip,*

*wherein the first representative chip is configured to turn on an ODT mode to perform the ODT operation when an ODT control signal received through an ODT pin is activated regardless of chip selection, and the first representative chip enters the ODT mode to perform the ODT operation instead of the first data write operation when the first memory structure receives a first data write command from the memory controller via the first channel and the different one of the first through N-th memory chips is a target chip for the first data write operation.*

* * * * *